United States Patent
Verschuren et al.

(10) Patent No.: US 9,379,356 B2
(45) Date of Patent: Jun. 28, 2016

(54) SEALED THIN-FILM DEVICE AS WELL AS METHOD OF REPAIRING, SYSTEM FOR REPAIRING AND COMPUTER PROGRAM PRODUCT

(71) Applicants: Nederlandse Organisatie voor toegepast-natuurwetenschappelijk onderzoek TNO, Delft (NL); Koninklijke Philips N.V., Eindhoven (NL)

(72) Inventors: Coen Verschuren, Eindhoven (NL); Antonius Maria Bernardus van Mol, Delft (NL); Peter van de Weijer, Eindhoven (NL)

(73) Assignees: Nederlandse Organisatie voor toegepast-natuurwetenschappelijk onderzoek TNO, Delft (NL); Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/360,563

(22) PCT Filed: Nov. 27, 2012

(86) PCT No.: PCT/NL2012/050842
§ 371 (c)(1),
(2) Date: May 23, 2014

(87) PCT Pub. No.: WO2013/081457
PCT Pub. Date: Jun. 6, 2013

(65) Prior Publication Data
US 2014/0346555 A1  Nov. 27, 2014

(30) Foreign Application Priority Data
Nov. 28, 2011 (EP) .................................. 11190975

(51) Int. Cl.
*H01L 51/52* (2006.01)
*H01L 51/56* (2006.01)

(52) U.S. Cl.
CPC ........ *H01L 51/5259* (2013.01); *H01L 51/5253* (2013.01); *H01L 51/56* (2013.01); *H01L 2251/568* (2013.01)

(58) Field of Classification Search
None
See application file for complete search history.

(56) References Cited

U.S. PATENT DOCUMENTS

2004/0061118 A1    4/2004  Yamazaki
2004/0224183 A1*  11/2004  Nakamata ........... H01L 51/5092
                                                                  428/690

(Continued)

FOREIGN PATENT DOCUMENTS

CN          1934700 A      3/2007

OTHER PUBLICATIONS

International Search Report from PCT/NL2012/050842, dated Mar. 6, 2013.

(Continued)

*Primary Examiner* — Fernando L Toledo
*Assistant Examiner* — Valerie N Newton
(74) *Attorney, Agent, or Firm* — Swanson & Bratschun, L.L.C.

ABSTRACT

The invention relates to a sealed thin-film device, to a method of repairing a sealing layer applied to a thin-film device to produce the sealed thin-film device, to a system for repairing the sealing layer applied to the thin-film device to generate the sealed thin-film device and to a computer program product. The sealed thin-film device comprises a thin-film device and a sealing layer applied on the thin-film device for protecting the thin-film device from environmental influence. The sealing layer comprises at least a first and a second barrier layer and a getter layer arranged between the first and the second barrier layer. The sealed thin-film device further comprises locally applied mending material for sealing a local breach in an outer one of said barrier layers.

5 Claims, 10 Drawing Sheets

(56) References Cited

U.S. PATENT DOCUMENTS

2005/0285521 A1 12/2005 Menda
2008/0237872 A1 10/2008 Nagayama

OTHER PUBLICATIONS

Office Action from CN 201280068183.X dated Dec. 4, 2015 with English translation.

* cited by examiner

SEALED THIN-FILM DEVICE AS WELL AS METHOD OF REPAIRING, SYSTEM FOR REPAIRING AND COMPUTER PROGRAM PRODUCT

RELATED APPLICATIONS

This application is a 35 U.S.C. §371 national phase application of PCT/NL2012/050842 (WO 2013/081457), filed on Nov. 27, 2012, entitled "Sealed Thin-Film Device as well as Method of Repairing, System for Repairing and Computer Program Product", which application claims priority to European Application No. 11190975.0, filed Nov. 28, 2011, which is incorporated herein by reference in its entirety.

BACKGROUND OF THE INVENTION

1. Field of the Invention

The present invention relates to a sealed thin-film device.

The present invention further relates to a method of repairing a sealed thin-film device.

The present invention still further relates to a system for repairing a sealed thin-film device.

The present invention still further relates to a computer program product which comprises instructions for causing a processor system to perform the steps of said method of repairing.

2. Related Art

Thin-film devices are devices which are constituted of a plurality of stacked layers which together constitute an electrical circuit, an electro-optical element or an optical element. Such electrical circuits typically are miniaturized electrical circuits, also known as Integrated Circuits or in short ICs, comprise stacks of conductive, semi-conductive and insulating layers. The electro-optical elements comprise stacks which, for example, constitute a light emitting diode, an organic light emitting diode or a laser diode, and thus typically at least partially have an electrical circuit equivalent to a diode-circuit combined with a light emitting layer which may, for example, be constituted of an organic light emitting layer which results in an Organic Light Emitting Diode (further also referred to as OLED). Optical elements may comprise several optical layers constituting an optical circuit comprising, for example, light guides and light gates. Such optical elements often may be designed to perform similar functions as Integrated circuits and are often designed to replace Integrated circuits.

All of these thin-film devices require some kind of sealing to protect the devices from environmental influences. The quality of the seal provided to the thin-film device often determines the operational life-time of the thin-film device. Especially when the thin-film device is an OLED device, the sealing of the OLED device is crucial because water causing corrosion effects inside the OLED device often locally generate black spots in the OLED device. Black spots due to the corrosion effect continue to grow radially starting from, for example, a local breach in the sealing layer. Over time, the corrosion effect becomes visible to the human eye which typically is unacceptable when the OLED device is used for (decorative) illumination purposes. Eventually the corrosion effect may destroy the whole OLED device preventing the OLED device from producing any light.

In known thin-film devices, the sealing may be done via a sealing chamber in which the thin-film device is located. However, to reduce a thickness of the thin-film device and to also reduce production cost of the thin-film device, the sealing is preferably done via a sealing layer directly applied to the thin-film device. Such sealing layers are well known, especially applied to OLED devices. Known sealing layers may, for example, comprise a stack of a plurality of layers comprising silicon nitride-organic material-silicon nitride. Therein the silicon nitride layers form barrier layers which form a strong barrier against moisture and other environmental substances. The organic layer may be relatively thin (few 100 nm), providing an effective decoupling of pinholes in the surrounding nitride layers. Alternatively, the organic layer may be relatively thick and thus also planarizes particles which may be present in any of the layers. Such stack of layers constituting the sealing layer does not prevent black-spots from occurring, but delays the growth of the black-spot as it forms a labyrinth for the water to enter the OLED device.

Alternatively the sealing layer may be constituted of a plurality of barrier layers or a layer constituted via electrochemical plating. The barrier layers for example inorganic layers, typically ceramic layers, for example, comprise stacks comprising silicon nitride-silicon oxide-silicon nitride, or silicon nitride-silicon oxinitride-silicon nitride, further also referred to as NON-stacks. Such NON-stacks typically comprise several repetitions of this basic stack, for example about eight layers (i.e. NONONON in which N represents silicon nitride and O represents silicon oxide). In these alternative sealing layers, the number of black spots occurring is strongly reduced. However, any remaining local breach in such alternative sealing layer causes the black-spot to continuously grow relatively fast (becoming visible within approximately 1 hour in a dampish environment). The occurrence of such a local breach is a production yield problem (# local breaches per surface area), which is disadvantageous for smaller devices, but is a much more serious problem for the production of larger devices.

So a disadvantage of the known sealed thin-film devices is that the operational life-time of the thin-film device is still too limited.

US2008l0237872 discloses a semiconductor apparatus having a sealing structure that allows high-precision detection of defects occurring in a protective film, and a method of manufacturing the same. A semiconductor apparatus includes a substrate, a semiconductor device formed on the substrate, and a protective film for sealing the semiconductor device. The semiconductor apparatus further includes a first conductive layer in contact with a back surface of the protective film, and a second conductive layer in contact with a front surface of the protective film. The protective film is made of one or more layers of films for preventing impurities such as moisture and oxygen from penetrating into the organic EL device in order to improve moisture-proof characteristics. The protective film may include a moisture absorbing film. If the protective film has any defect the first conductive layer and the second conductive layer are electrically conductive via the defect. On the other hand, if the protective film has no defect, there exists little electrical conduction between the first conductive layer and the second conductive layer, so that the electric conductivity between the two layers is low and the electric resistance between the layers is high. Thus, if the detector judges that there is electrical conduction between the electrode terminals, it determines that the protective film has a defect. On the other hand, if the detector judges that there is no electrical conduction between the electrode terminals, it determines that the protective film has no defect. It is a disadvantage of the known apparatus and method that the apparatus requires the conductive layers on both sides of the protective film as additional means to locate the defects in the protective film. At least the conductive layer on the outer side of the protective film has no function during use of the device.

Moreover, the non-functional layer reduces transmission of the protective film, which in particular is a disadvantage in case of an electro-optic device, such as an OLED or a photovoltaic device.

WO 2010136938 A1 also relates to a method of repairing a sealing layer applied to a thin-film device to produce a sealed thin-film device, wherein local breaches in the sealing layer are optically detected. Optical detection may, for example, be done by impinging light on the thin-film device via a relatively collimated beam and to detect the reflected or scattered light. Variations in the local reflection or scatter intensity may be caused by a local breach. Another embodiment comprises a step of activating the thin-film device to emit light and subsequently optically detecting the local breach in the sealing layer by detecting the location of a black spot. In this way additional detection means in the product that are no longer functional during normal use of the product are not necessary. Subsequently, mending material is locally applied where a defect is detected by the optical detection method. Detecting defects in the sealing layer by reflected or scattered light may also result in so called "false alarms". This implies that more spots are mended than is necessary to repair the sealing layer, which unnecessary retards the reparation process. It is noted that US2004061118 discloses a light emitting element provided with a stack of layers for protection of moisture. The stack of layers comprises an inorganic insulating film, a transparent and hygroscopic stress relaxation layer and an inorganic insulating film. These layers are repeatedly laminated over a cathode. However, if a black spot detection is used it can not be prevented that the device already has incurred some damage. Moreover due to a natural variation in size of the defects, some black spots can be detected earlier than other ones. If repair is postponed until a sufficient large fraction of the defects is visible, some of those defects may already have already resulted in visible damage of the device. It may be possible to repeat the detect and repair process a number of times, each time repairing defects that become detectable. However, the latter is time-consuming.

It is an object of the present invention to provide an improved sealed thin film device.

It is a further object of the present invention to provide an improved rep air method.

It is a further object of the present invention to provide an improved rep air system.

It is a further object of the present invention to provide an improved computer program product.

According to a first aspect a sealed thin-film device is provided as claimed in claim 1.

The sealed thin-film device according to the first aspect of the invention comprises a thin-film device and a sealing layer comprising a first and a second barrier layer, applied on the thin-film device for protecting the thin-film device from environmental influence. The sealed thin-film device further comprises locally applied mending material for sealing a local breach in an outer one of said barrier layers (also denoted as outer barrier layer). The sealed thin-film device further comprises a getter layer arranged between said first and said second barrier layer that has a detectable deviation at the location of said sealed local breach. The getter layer is capable of binding moisture chemically or by adsorption. Usually getter materials may also be capable of binding other substances. Both organic and inorganic getter materials are. Most of these materials show an (optically) detectable change upon exposure to moisture or other substances with which they interact.

Suitable inorganic getter materials may include, but are not limited to
- rare earth metals (examples of which include, but are not limited to: Li, Na, K),
- rare earth metal oxides (examples of which include, but are not limited to: Li2O, Na2O, K2O),
- alkaline earth metals (examples of which include, but are not limited to: Ca, Ba, Mg),
- alkaline earth metal oxides (examples of which include, but are not limited to: CaO, BaO, MgO),
- transition metals (examples of which include, but are not limited to: Hf, Ti, Al, Cr, V, Zr),
- transition metal oxides (examples of which include, but are not limited to: PbO, Bi2O3, SrO, ZnO, CuO),
- boron oxide,
- high valency metal chlorides such as SiCl4, WCl6, ZrCl4, TiCl4, CoCl2,
- P2O5,
- amorphous hydrogenated silicon carbide,
- salts of cesium (examples of which include, but are not limited to: CsF),
- lanthanide salts (examples of which include, but are not limited to: LaF3),
- silicate,
- alumina,
- organometallic complexes of metals with a coordination number of 6,
- zeolites (examples of which include, but are not limited to molecular sieves),
- clay dessicants.

Suitable organic getter materials for this purpose may include, but are not limited to
- (poly)alkoxy silanes (examples of which include, but are not limited to: 3-trimethoxysilylpropylmethacrylate),
- (poly)isocyanates (examples of which include, but are not limited to: poly[(phenyl isocyanate)-co-formaldehyde]),
- (poly)oxazolidines (examples of which include, but are not limited to: 3-ethyl-2-methyl-2-(3-methylbutyl)-1,3-oxazolidine (Zoldine® MS-PLUS)),
- (poly)anhydrides,
- (poly)cyanoacrylates,
- linear polysugars (examples of which include, but are not limited to: polysaccharides, cellulose, hydroxyethylcellulose),
- cyclic polysugars (examples of which include, but are not limited to: cyclodextrins)

WO/2009/102201 filed by the same Applicant provides examples of inorganic materials for use as a barrier layer and organic materials for use as a decoupling layer between the barrier layers. Earlier European patent application 10188769.3 also filed by the same Applicant specifically describes organic materials for use in a decoupling layer and in a getter layer.

Different options are possible to apply the getter layer. According to a first option the getter layer is provided as a homogeneous layer of group I or group II metal or their oxides, such as BaO or CaO. It has been found that breaches in the sealing layer can best be detected in embodiments wherein the getter layer is formed as an organic layer mixed with finely dispersed (nano) particles. Light impingent on this type of layer is scattered in a way that depends on the amount of moisture or other substance bound by the getter material, which strongly facilitates detection of breaches. Preferably the getter material used is capable of chemically binding the substance to be gettered. These materials have as advantage over physically binding getters that the substance is substantially irreversibly removed. Examples of chemically binding getters are group I or group II metal or their oxides, such as BaO or CaO. Zeolites are examples of physically binding getters.

A local breach is defined as a local variation in a barrier layer which allows harmful environmental substances to enter the thin-film device to damage or start damaging the thin-film device. In this respect, the word breach is specifically used because breach is defined as "a failure to perform some promised act or obligation". The promised act of the sealing layer is to seal the thin-film device from harmful environmental substances, which, at the locations of the local breach does not occur. So according to the current invention, a local breach may comprise a pinhole and/or gap and/or rupture in the outer barrier layer. In addition, the local breach according to the current invention may also comprise a local area which fails to perform the act of sealing, for example, due to the fact that locally the outer barrier layer may be too thin or which may locally be porous such that the harmful environmental substances may diffuse gradually through the sealing layer into the thin-film device despite the sealing layer.

The sealed thin-film device according to the first aspect of the present invention can be obtained as a result of a repair method according to the second aspect of the invention.

In the method according the second aspect the sealed thin-film device is exposed to an environment comprising a detection substance capable to cause a detectable change to said getter material, therewith allowing said detection substance to penetrate a local breach in an outer one of said barrier layers (outer barrier layer) and to cause a detectable deviation in the getter layer at the location of the breach, the local breach in the sealing layer is then detected by detecting the deviation of the getter layer, and mending material is locally applied for sealing the local breach to produce the sealed thin-film device.

In this description the outer one of said barrier layers will also be denoted as "outer barrier layer". The wording "outer barrier layer" is to denote a barrier layer that is arranged at a side of the getter layer opposite the thin film device. However, the outer barrier layer may on its turn be covered by a further barrier layer.

An effect of the sealed thin-film device according to the invention is that a local breach is sealed via locally applying the mending material. As a result, the mending material seals the barrier layer and stops the entering of harmful environmental substances, thus improving the operational life-time of the thin-film device. As the defect becomes detectable by a deviation of the getter layer it can be detected before it has resulted in damages to the thin-film device.

An additional benefit of the sealed thin-film device according to the invention is that the production yield for producing sealed thin-film devices is substantially increased. Without the local applying of mending material, substantially any local breach on the thin-film device comprising a sealing layer may be unacceptable. Especially when producing relatively large thin-film devices, for example, when the thin-film device is an OLED, the production yield will be very low. By locally applying mending material, the thin-film device comprising the sealing layer which previously had to be rejected due to the presence of a local breach, now can be repaired, thus significantly improving the production yield of sealed thin-film devices.

A further benefit of the sealed thin-film device according to the invention is that only very little of the mending material is required for sealing the local breach. Typically, most of the surface of the thin-film device which must be sealed is actually sealed via the sealing layer applied on the thin-film device. A high quality sealing layer still may have some remaining local breaches, for example, typically 100 per square meter. These remaining local breaches often have the size of a few microns. However, when having such a small local breach in an OLED device the resulting black-spot will actually continue to grow, until eventually the black spot may cause end of operational life of the OLED device. Locally sealing these relatively small remaining breaches clearly requires only very little mending material.

An even further benefit of the sealed thin-film device according to the invention is that the materials to choose from to use as mending material may be relatively large. A local breach may already be detectable at a relatively early stage, for example, while the detectable deviation in the moisture absorbing layer caused by the breach in the OLED device is still smaller than a dimension which is noticeable with a naked human eye. The locally applied mending material typically may also be applied at dimensions which are smaller than a dimension noticeable with the naked human eye. As such, even substantially opaque material may be used for sealing a local breach, even when the local breach may be located at a light-emitting side of the thin-film device and actually blocks part of the emitted light. The opaque mending material is scarcely visible due to its dimension and the portion of the light blocked by it.

The deviation in the getter layer may be optically detectable. It is not necessary that the deviation is optically detectable in a visible wavelength range. In an embodiment the deviation is for example detectable by a deviation of the reflectivity in an infrared or ultraviolet wavelength range.

The inventors have realized that the applying of a barrier layer always comprises a risk that dust-particles will be embedded in the barrier layer which may cause local breaches in the barrier layer. Such local breaches may leak harmful environmental substances through the barrier layer such that they may be able to harm the thin-film device and as such reduce the operational life-time of the thin-film device. Adding further barrier layers to seal the already sealed thin-film device only partially resolves the problem, as each further barrier layer again bears the risk of having dust-particles embedded which may again form a local breach of the further barrier layer. Adding further barrier layers has a further negative effect in that each additional barrier layer adds a production step to the sealed thin-film device which increases the cost of the sealed thin-film device while the operational life-time improvement may not be significant and/or sufficient. By locally applying mending material according the invention, the risk of embedding additional dust-particles in the mending material is greatly reduced as it is only applied very locally. Furthermore, typically a single production step is required to be added to locally apply the mending material to the sealing material for closing the local breach and thus to seal the sealing layer rather than adding a plurality of production steps to reduce the chance of having remaining local breaches. The inventors have further realized that automated detection means and automated mending means may relatively easily be implemented in an in-line production line for producing sealed thin-film devices. Many different known camera systems may be applied in-line in a production facility for detecting and identifying any minute local breaches. Subsequently many different known deposition techniques may be adapted relatively easily to locally deposit the mending material, such as, for example, printing techniques of, for example, liquefied mending material which may subsequently be cured to seal the local breach. These detection and printing techniques may also be applied in in-line production facilities to scarcely disrupt the production process. As such, the production time and costs for the sealed thin-film devices may be increased only marginally while the operational lifetime of the produced sealed thin-film devices and the yield of producing the sealed thin-film devices have increased significantly.

In an embodiment of the sealed thin-film device, the thin-film device is a light emitting thin-film device. Light emitting material may, for example, be organic light emitting material. Such organic light emitting diode device typically is sensitive to water damaging the aluminium electrode causing so-called black spots in the organic light emitting diode device which continue to grow radially starting from the location in the sealing layer where moisture penetrates the device. This radial growing of the black spot is a continuous process. Especially due to the fact that organic light emitting diode devices typically comprise relatively large light emitting surfaces, the chance of having, for example, a dust particle somewhere on the relatively large light emitting surface expanding to become a visible black spot is very large. This seriously limits the production yield of such organic light emitting diode devices. Other means of encapsulation of the organic light emitting diode devices are possible, however when wanting to reduce the thickness of the organic light emitting diode device and/or when wanting to reduce the production cost simple encapsulation via the applying of a sealing layer over the organic light emitting diode device is preferred. To produce flexible organic light emitting diode devices, sealing through the applying of a sealing layer on the organic light emitting diode device is essential. As such, any breach in this sealing layer has the above described effect which clearly limits the yield and/or the operational life-time of the organic light emitting diode. The current invention provides a solution for increasing the yield and/or operational life-time of the organic light emitting diode device comprising a sealing layer by locally applying mending material to the breaches detected in the outer barrier layer the sealing layer.

In an embodiment of the sealed thin-film device, the locally applied mending material comprises inorganic material configured for sealing the local breach and configured for being locally deposited.

To be able to be locally deposited, the mending material may, for example, be solvable in a solvent after which the solvent may be applied, for example, via inkjet-printing of the solvent. Alternatively, the mending material may be applied as a paste which may be locally applied to seal the outer barrier layer. Even further alternatively, particles of the mending material may be charged after which these charged particles may be locally applied to an oppositely charged part of the outer barrier layer, similar to copying techniques and/or laser-printing techniques. A benefit of the use of this inorganic material as mending material is that such inorganic material typically is inert and intrinsically comprises good barrier properties.

In an embodiment of the sealed thin-film device, the locally applied mending material comprises metal material configured for sealing the local breach and configured for being locally deposited. A benefit of this embodiment is that, next to the good barrier properties, various deposition techniques and precursor materials are available for high-quality deposition.

In an embodiment of the sealed thin-film device, the locally applied mending material comprises locally cured sealing material from the outer barrier layer for sealing the local breach. The local curing may, for example, comprise thermal curing or curing via ultraviolet light or via any other means of curing the sealing material. Before curing the sealing material, the sealing material may locally be softened such that it may flow and close the local breach. Thermal curing may, for example, be done locally using laser curing techniques without damaging the remainder of the sealing layer and without damaging the thin-film device.

In an embodiment of the sealed thin-film device, the locally applied mending material comprises two different materials together sealing the local breach in the outer barrier layer. Although the two-step process for sealing local breaches in a outer barrier layer typically is more elaborate and more expensive, the choice of materials to be used is further expanded allowing to, for example, improve the sealing of the local breach and/or allowing to, for example, use materials which together may be used more cost effectively compared to the use of a relatively expensive single material. As such, this two-material repair process may be beneficial to the sealed thin-film device according to the invention.

In an embodiment of the sealed thin-film device, the mending material comprises two different materials comprising an adhesion material and a closing material, the adhesion material being applied to the outer barrier layer for improving an adhesion of the closing material to seal the local breach. The adhesion layer may conveniently be applied homogeneously over the outer barrier layer because the adhesion layer only is used to ensure adhesion of the closing material to seal the local breach. Any additional particles present in the adhesion layer would substantially not be harmful as typically no migration through the outer barrier layer of harmful substances from the environment occurs through such layers. Furthermore, the chance that such additional particle is located at the exact location of the local breach is so small that this hardly influences the production yield of the sealed thin-film device. The actual closing material is deposited locally to seal the outer barrier layer at the identified local breach. Alternatively both the adhesion material and the closing material are both deposited locally to seal the local breach.

In an embodiment of the sealed thin-film device, the mending material comprises two different materials comprising a metal base-material and a metal closing material for sealing a further local breach in the metal base-material, the metal base-material being applied to the outer barrier layer. The metal closing material may be applied at a relatively large thickness. A benefit of this embodiment is that it allows electro-less deposition for thick metal closing layer resulting in a low-cost solution which is relatively easy to integrate.

In an embodiment of the sealed thin-film device, the mending material comprises two different materials comprising a substantially droplet-shaped or substantially spherically shaped first material and a closing material, the substantially droplet shaped or substantially spherically shaped first material having a contact angle between the substantially droplet-shaped or substantially spherically shaped first material and the sealing layer of less than 45 degrees, the closing material covering the substantially droplet-shaped or substantially spherically shaped first material for completely sealing the local breach. A benefit of this embodiment is that a low-cost, even permeable first material may be used, which may be applied at low-cost and high speed using a wide range of techniques for effective covering of the local breach, for example, of particles and/or fractures. Subsequently, only a thin closing layer is needed.

In an embodiment of the sealed thin-film device, the mending material comprises two different materials comprising a first material comprising a getter material and a closing material, the first material reducing water entering the local breach and the closing material being applied on the first material for sealing the local breach. One of the most common harmful substances for thin-film devices is water entering the thin-film device. Getter material absorbs water. Applying the first material comprising the getter material causes any water or moisture present to be absorbed by the getter material rather than to migrate via the local breach into the thin-film device. As such, the first material acts as a kind of water-barrier and as such increases the operational life-time of the thin-film device. The subsequent closing material seals the local breach and is applied over the first material. As such, any remaining leakage of water or moisture through the closing material will be absorbed by the getter material in the first material. In this embodiment the getter material in the first material compensates for a loss of moisture binding material in the detectable deviating portion of the getter layer.

In an embodiment of the sealed thin-film device, the locally applied mending material is at least partially transparent to light emitted by the thin-film device. In this embodiment the thin-film device is a light emitting thin-film device. A benefit of this embodiment is that the at least partially transparent mending material does not block any light emitted from the organic light emitting layer and as such causes the deposited mending material not to be visible. In addition, due to the typical Lambertian light emitting property of organic light emitting layers, part of the light emitted at regions adjacent to the applied mending material will emit light through the applied mending material, further reducing the local intensity variation due to the presence of the local breach and due to the presence of the black-spot originated from the presence of the breach. Furthermore, due to the fact that part of the light emitted by the OLED device is captured inside the layers of the OLED device via internal reflection. The presence of the substantially transparent mending material may cause additional light to be extracted by the deposited mending material further reducing any intensity variations at the location of the sealed breach.

In an embodiment of the sealed thin-film device, a dimension of the locally applied mending material is configured for being substantially invisible to a naked human eye.

This typically means that the dimension should be smaller than the minimum feature size which is noticeable by the human eye and/or minimum intensity variation which is noticeable by the human eye. This may differ, for example, due to the light emitting characteristics of the OLED and/or due to the presence of a diffuser on top of the sealing layer and/or due to the processing of the OLED for generating an image. For example, when the OLED is typically applied to the ceiling in a room and is used for illuminating the room, the minimum intensity variations which may still be visible may be more important than the noticeable minimum dimensions. In other applications, the minimum noticeable dimension may be important.

The method of repairing a sealing layer applied to a thin-film device to generate a sealed thin-film device according to the second aspect of the invention comprises detecting a local breach in the outer barrier layer, and locally applying mending material for sealing the local breach to produce the sealed thin-film device.

In an embodiment of the method of repairing, the method further comprises a step of maintaining the thin-film device comprising the sealing layer in a predetermined environment for a predetermined time-period before performing the step of detecting the local breach in the sealing layer or while performing the step of detecting the local breach in the outer barrier layer. By having the thin-film device in a predetermined environment for a predetermined time-period, the binding of moisture or another detection substance leaking via the local breaches to the getter layer may be controlled and may be allowed to cause detectable changes in the getter layer. These changes may for example be detected with an automated image capturing and analyzing system, which therewith is well capable of localizing the location of the changes and as such the location of the local breaches in the outer barrier layer. The predetermined time-period depends on the environment in which the thin-film device is maintained, for example, depends on the temperature and humidity at which the thin-film device is maintained. The predetermined time-period also depends on the minimum dimensions which are detectable by the image capturing device used in the method and on the dimensions of the local breaches which still have to be sealed via the method of repairing the sealing layer. In practice ample time is available between the moment that the deviations in the getter layer become detectable, and the moment that damage starts to occur in the thin-film device. It has been found that it is not necessary to mend each breach in the outer barrier layer. In practice a long life-time can be guaranteed if the most significant breaches in the outer barrier layer are mended. These are the breaches that first become detectable from deviations in the getter layer.

A thickness of the getter layer may be dimensioned to take into account that a portion thereof is locally used while detecting the local breaches of the outer barrier layer. If the absorption of the detection substance by the getter layer only causes non-visible deviations, e.g. deviations that are optically detectable only in a wavelength range outside the visual spectrum, the detectable deviations may be allowed to grow to a relatively large size.

In an embodiment of the method of repairing, the method further comprises a step of applying mechanical stress to the thin-film device for generating a local breach in a mechanically weak area of the thin-film device. Due to the mechanical stress, a local breach may occur in mechanical weak areas. Such local breach may subsequently be sealed via applying the mending material according to the invention. Due to the applying of mechanical stress, local breaches in mechanically weak areas are forced to occur already during the production process which allows these local breaches to be detected and sealed via the method according to the invention. Mechanically weak areas may, when not detected, later result in reliability issues of the thin-film device. So by inducing stress during the production method, these reliability issues may be resolved or reduced during production of the sealed thin-film device. Mechanical stress may be induced in the thin-film device, for example, via temperature variation and/or differences, or, for example, via deforming the thin-film device, in particular controlled bending to a predefined radius.

In the method of repairing, the step of detecting the local breach comprises optically detecting the local breach in the outer barrier layer. As indicated before, many image capturing systems may be used for such image capturing of local breaches in the outer barrier layer well before any defects caused by these local breaches become visible with the naked human eye. Optical detection may, for example, be done by impinging light on the getter layer via a relatively collimated beam and to detect the reflected or scattered light. Variations in the local reflection or scatter intensity may be caused by a local breach. In such an embodiment, the collimated light beam may be swept across the sealing layer while detecting the reflected or scattered light. As such, using an optical detection method may be relatively easily implemented. A further benefit is that optical detection typically may be done without contacting the thin-film device.

In an embodiment of the method of repairing, the step of detecting the local breach comprises a step of activating the thin-film device to emit light and subsequently optically detecting the local breach in the sealing layer, for example, by detecting a deviation of the transmission of the getter layer. In the embodiment that the thin-film device is a light emitting thin-film device, the activation of the thin-film device causes the thin-film device to start emitting light. Local changes in the emitted light at a side of the outer barrier layer may be detected via a camera which also determines the location of the local breach and provides this location information to a mending means which subsequently applies the mending material at the detected location. No additional light source is required to illuminate the thin-film device and as such the detection of the local breach is simplified. Furthermore, the intensity of the light emitted by the thin-film device may be adapted to, for example, match with the requirements of the detection system or to, for example, optimize the detection of local breaches.

An additional advantage of the method of repairing in which the thin-film device is activated is that only actual local breaches are detected, whereas an external optical method in which light impinging on the thin-film device for detecting a local breach may detect also topographic imperfections, including those topographic imperfections which have already been sealed by the original sealing layer or which have already been sealed in a previous similar repairing step.

In an embodiment of the method of repairing, the step of locally applying the mending material comprises a step of locally depositing an inorganic material for sealing the local breach. In an embodiment of the method of repairing, the step of locally applying the mending material comprises a step of locally depositing a metal material for sealing the local breach. A benefit of these embodiments is that inorganic materials and metals typically are inert and intrinsically comprise good barrier properties. A further benefit of these embodiments is that it provides a deposition method which provides a relatively fast way of depositing mending material and the possibility to (locally) deposit relatively thick layer of mending material to seal, which would be relatively time consuming and expensive if this has to be done over the total area of the device.

In an embodiment of the method of repairing, the step of locally applying the mending material comprises a step of depositing an adhesion material to the outer barrier layer for improving an adhesion of a closing material, and subsequently a step of locally depositing the closing material for sealing the local breach. The step of applying the adhesion layer may conveniently comprise applying the adhesion layer homogeneously over the outer barrier layer because the adhesion layer only is used to ensure adhesion of the closing material to seal the local breach. As indicated before, any additional particles present in the adhesion layer would substantially not be harmful as typically no migration through the sealing layer of harmful substances from the environment occurs through such adhesion layers. Furthermore, the chance that such additional particle is located at the exact location of the local breach is so small that this hardly influences the production yield of the sealed thin-film device. The actual closing material is deposited locally to seal the sealing layer at the identified local breach. Alternatively, both the step of depositing the adhesion material and the step of depositing the closing material are both done locally to seal the local breach.

In an embodiment of the method of repairing, the step of locally applying the mending material comprises a step of depositing a metal base-material to the outer barrier layer, and subsequently a step of locally depositing and a metal closing material for sealing a local further breach in the metal base-material.

In an embodiment of the method of repairing, the step of locally applying the mending material comprises a step of locally depositing a substantially droplet-shaped or substantially spherically shaped first material, and subsequently a step of depositing a closing material for covering the substantially droplet-shaped or substantially spherically shaped first material to seal the local breach, the substantially droplet shaped or substantially spherically shaped first material having a contact angle between the substantially droplet-shaped or substantially spherically shaped first material and the sealing layer of less than 45 degrees.

In an embodiment of the method of repairing, the step of locally applying the mending material comprises a step of depositing a first material comprising a getter material, and subsequently a step of locally depositing a closing material to seal the local breach, the first material reducing water entering the local breach. As indicated before, getter material absorbs water. Applying the first material comprising the getter material causes any water or moisture present to be absorbed by the getter material rather than to migrate via the local breach into the thin-film device. As such, the first material acts as a kind of water-barrier and as such increases the operational life-time of the thin-film device. The subsequent closing material seals the local breach and is applied over the first material. As such, any remaining leakage of water or moisture through the closing material will be absorbed by the getter material in the first material. The getter material in the first material compensates for getter material in the getter layer that was lost for the purpose of creating a detectable deviation.

In an embodiment of the method of repairing, the step of locally applying the mending material comprises locally applying the mending material via laser transfer of the mending material. A benefit of this embodiment is these techniques are non-contact techniques preventing damage to the thin-film device which may result from contacting the thin-film device. Furthermore, such techniques for applying the mending material may be techniques in which the mending material is locally applied fast, resulting in relatively small impact on the overall production process.

In an embodiment of the method of repairing, the step of locally applying the mending material comprises locally applying the mending material via printing a liquid precursor of the mending material being subsequently converted into the mending material for sealing the local breach. A benefit of this embodiment is that the deposition of the mending material may be done fast and that this technique is compatible with roll-to-roll and related deposition techniques.

In an embodiment of the method of repairing, the step of locally applying the mending material comprises locally applying the mending material via electroplating of the mending material. Because the current for generating the electroplating only needs to be applied locally, a relatively high growth-speed for growing a relatively thick layer may be possible. As such, the locally applying of the mending material via electroplating is possible without too high increase of the production time of the sealed thin-film device.

In an embodiment of the method of repairing, the step of locally applying the mending material comprises a step of locally applying curing for locally curing sealing material from the outer barrier layer for sealing the local breach. The step of applying local curing may comprise thermal curing of the sealing layer to seal the breach, or may comprise curing via, for example, UV-radiation which is locally impinged on the outer barrier layer to seal the breach. A benefit of this embodiment is that the deposition of the mending material may be done fast and that this technique allows relatively low-cost curing.

In an embodiment of the method of repairing, the step of locally applying the mending material comprises locally applying mending material being at least partially transparent to light emitted by the thin-film device, or wherein the step of locally applying the mending material comprises a step of generating a dimension of the locally applied mending material being configured for substantially being invisible to a naked human eye. Benefits of both the use of at least partially transparent mending material and of mending material having a dimension such that they are substantially invisible to the naked human eye have already been discussed in a previous part.

The third aspect of the invention comprises a system for repairing a sealing layer applied to a thin-film device for generating a sealed thin-film device, the sealing layer being applied to the thin-film device for protecting the thin-film device from environmental influence, the sealing layer comprising at least a first and a second barrier layer, a getter layer being present between the first and the second barrier layer, the getter layer comprising a getter material, the system comprising:
   exposing means for exposing the sealed thin-film device to an environment comprising a detection substance capable to cause a detectable change to said getter material,
   detection means for detecting a local breach in an outer one of said first and second barrier layer (outer barrier layer), by a detectable deviation of the getter layer,
   analyzing means for localizing the local breach after detection by the detection means and subsequently providing location information to a mending means, and
   mending means for receiving location information from the analyzing means and for locally applying the mending material for sealing the local breach in the outer barrier layer.

Such system for repairing the sealing layer applied to the thin-film device may beneficially be placed in a production line of the thin-film device to ensure that the operational life-time of the produced thin-film devices is improved. While the thin-film device is produced, the thin-film device may be scanned by the detection means while, for example, being transported from one part of the production process to another. This scanning may be similar to the scanning techniques used for scanning documents. Subsequently mending means may be constituted as a printing device which subsequently uses the location information from the detection means and locally deposits the mending material while the thin-film device continues to be transported from the one part of the production process to another. As such, the system may relatively easily be integrated in a production process without disturbing the normal production flow too much.

Alternatively, the system for repairing the sealing layer may be applied separate from the production line or may be distributed at different locations of the production line. For example, the detection means may be located in the production line of the thin-film devices such that each thin-film device is checked for local breaches in the sealing layer. If the local breaches are acceptable and do not need to be repaired, the thin-film device simply continues its normal production process. However, if the local breaches are not acceptable and need repairing, the thin-film device is moved to the mending means of the system to apply the mending material for sealing the local breach. As such, different parts of the system may be located at different parts in the production process.

Even further alternatively, the system for repairing may, for example, not be in the standard production process of the thin-film devices, but only is used to repair rejected thin-film devices. Such a system separate from the production process may also be used to repair the sealing layer of thin-film devices which already have been through the repair process of the sealing layer but this first repair process was not done successfully.

In an embodiment of the system, the system further comprises timing-means and environmental-control means, the timing-means together with the environmental-control means being configured for maintaining the thin-film device comprising the sealing layer in a predetermined environment for a predetermined time-period before the detection means starts detecting the local breach in the outer barrier layer or while the detection means is detecting the local breach in the outer barrier layer. As indicated before, when the thin-film device is an OLED device, the defects in the OLED device, also known as black spots, continue to grow gradually. By having the thin-film device in a predetermined environment for a predetermined time-period, the leakage of the detection substance from the environment through the breaches may be controlled such that occurrence of black spots is prevented or are allowed to grow to a size in which the black spots may still be too small to be detected with the naked human eye, while an automated image capturing and analyzing system is well capable of localizing the local breaches in the sealing layer by the detectable deviations of the getter layer. The predetermined time-period depends on the environment in which the thin-film device is maintained, for example, depends on the temperature and humidity at which the thin-film device is maintained. The predetermined time-period also depends on the minimum dimensions which are detectable by the image capturing device used in the method and on the dimensions of the local breaches which still have to be sealed via the method of repairing the sealing layer.

Alternatively, the system may also comprise further timing-means and further environmental control means which are configured for maintaining the sealed thin-film device. This further environmental control means and further timing means may, for example, be used to check whether the applied repair of the sealing layer has succeeded. If the repair was not good enough, the identified detectable deviations in the getter layer continue to grow in the further environmental control means which may be detected by continuously monitoring the thin-film device or via comparing the detected local breaches with the detected local breaches by the detection means before repair. As such, the sealing of the breach may be guaranteed using the further environmental control means. For such system a further detection means seems to be preferred. The analyzing of the two images or of the image detected by the detection means may be done by the analyzing means or by a further analyzing means.

In an embodiment of the system, the system further comprises stress-inducing means for generating a local breach in a mechanically weak area of the thin-film device. Such stress-inducing means enables the repair of mechanically weak areas which may later result in reliability issues of the thin-film device. Stress-inducing means may induce stress in the thin-film device, for example, via temperature variation and/or differences, or by, for example, deforming the thin-film device.

In an embodiment of the system, the system further comprises activation means for activating the thin-film device to emit light. These activation means may, for example, comprise contacts for electrically contacting the thin-film device, and may, for example, comprise a power supply which may be controlled to activate the thin-film device to emit light.

Due to the emission of light from the thin-film device, local changes in the emitted light due to deviations in the getter layer may be detected via a camera which also determines the location of the local breaches. Subsequently this location information may be used by the mending means to seal the local breach by applying the mending material at the detected location. No additional light source is required to illuminate the thin-film device and as such the detection of the local breach is simplified. Furthermore, the intensity of the light emitted by the thin-film device may be controlled by the power supply connected to the thin-film device to, for example, match with the requirements of the detection system or to, for example, optimize the detection of local breaches. For example, when the light intensity of the light emitted from the thin-film device is too high, the intensity variations due to a small deviation in the getter layer may be substantially undetectable by the detection system, while the same detection system may easily detect the same deviation when the intensity of light emitted by the thin-film device is reduced. As such, the optimal illumination situation may experimentally be found.

In an embodiment of the system, the mending means comprises laser transfer means for transferring the mending material via laser irradiation to seal the local breach. In an embodiment of the system, the mending means comprises printing means for printing a liquid precursor of the mending material being subsequently converted into the mending material to seal the local breach. In an embodiment of the system, the mending means comprises electroplating means for transferring the mending material via electroplating to seal the local breach. In an embodiment of the system, the mending means comprises curing means for locally applying curing of the sealing material of the sealing layer for sealing the local breach.

The fourth aspect of the invention comprises a computer program product which comprises instructions for causing a processor system to perform the steps of the method of repairing a sealing layer applied to a thin-film device to produce a sealed thin-film device.

BRIEF DESCRIPTION OF THE DRAWINGS

These and other aspects of the invention are apparent from and will be elucidated with reference to the embodiments described hereinafter.

In the drawings:

FIG. 7B shows the thin-film device according said further embodiment,
with a local breach,
FIG. 7C shows the thin-film device according said further embodiment,
with a detectable deviation caused by the local breach,
FIG. 7D shows the result of a first step of a method of repairing of the thin-film device according said further embodiment
FIG. 7E shows the result of a second step of the method of repairing of the thin-film device according said further embodiment.

The figures are purely diagrammatic and not drawn to scale. Particularly for clarity, some dimensions are exaggerated strongly. Similar components in the figures are denoted by the same reference numerals as much as possible.

DETAILED DESCRIPTION OF EMBODIMENTS

Figure 1A:
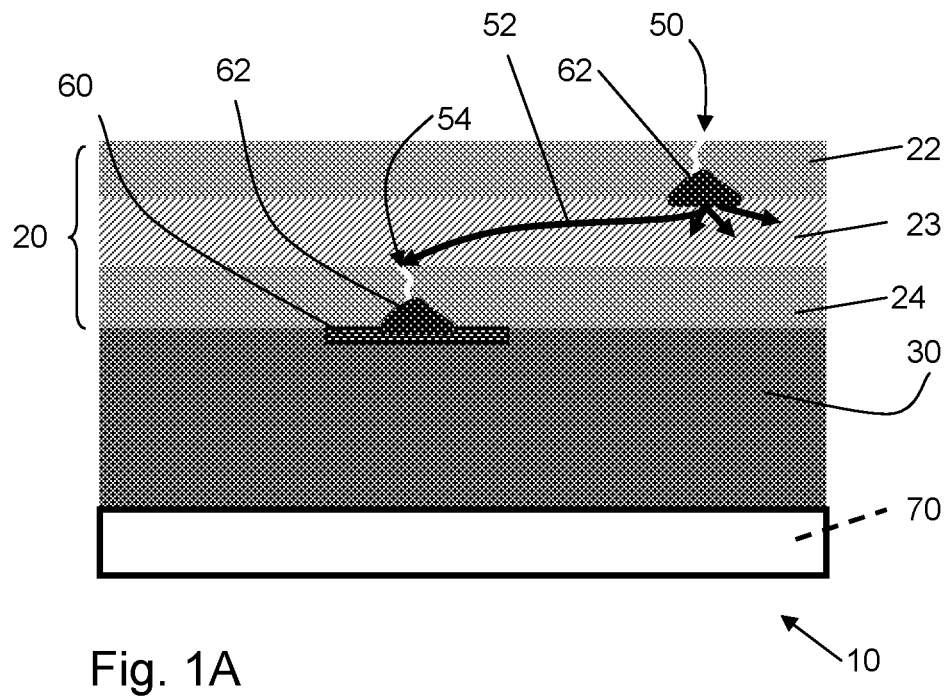
FIG. 1A shows a schematic cross-sectional view of a thin-film device comprising a sealing layer and a local breach.

FIG. 1A shows a sealed thin-film device 10 comprising a thin film device 30 and a sealing layer 20 with a first and a second barrier layer 22, 24 having a local breach 50, 54 respectively. Thin-film devices 30 typically comprise of a plurality of stacked layers (not shown) which together constitute an electrical circuit 30, an electro-optical element 30 or, for example, an optical element 30. Such electrical circuit 30 typically is a miniaturized electrical circuit, also known as IC. The electro-optical element 30, for example, comprises a light emitting diode 30, an organic light emitting diode 30 or a laser diode 30, and thus typically at least partially comprises an electrical circuit equivalent to a diode-circuit (not shown) combined with a light emitting layer (not shown) which may, for example, be constituted of an organic light emitting layer (not shown) which results in an Organic Light Emitting Diode 30 (further also referred to as OLED). An optical element 30 may comprise of several optically layers constituting an optical circuit 30 comprising, for example, light guides (not shown) and light gates (not shown). Such optical element 30 often is designed to perform similar functions as Integrated Circuits and is often designed to replace Integrated Circuits.

Each of these thin-film devices 30 require some kind of sealing layer 20 to protect the thin-film device 30 from environmental influence. The quality of the seal provided to the thin-film device 30 often determines the operational life-time of the thin-film device 30. It has been found that barrier layers form a relatively strong barrier for moisture and other harmful atmospheric substances. However, in practice a barrier layer may still have as much as 107 breaches per m2. A sealing layer 20 is therefore typically implemented as a stack comprising at least a first and a second barrier layer 22, 24 that are decoupled by a further, decoupling layer. In this way a tortuous path is created between breaches 50, 54 in the first and the second barrier layer. Therewith the sealing layer has forms a substantially better barrier than a single barrier layer. FIG. 1A shows an example wherein the sealing layer 20 is formed by a first barrier layer 22, an organic planarization layer 23 and a second barrier layer 24. Especially when the thin-film device 30 is an OLED device 30, the sealing of the OLED device 30 is crucial because water which causes corrosion effects inside the OLED device often locally generates black spots 60 in the OLED device 30. Black spots 60 due to the corrosion effect continue to grow radially starting from, for example, the local breach 50 in the sealing layer 20. Such local breach 50 may be caused due to the presence of a dust particle 62 before or while the sealing layer 20 is applied to the thin-film device 30. FIG. 1A illustrates how moisture penetrates the thin film device 30 via a breach 50 in the first barrier layer 22, a diffusion path 52 in the decoupling layer 23 and a breach 54 in the second barrier layer 24 and therewith causes the black spot 60. Over time, the corrosion effect becomes visible to the human eye which typically is unacceptable when the OLED device 30 is used for illumination purposes. Eventually the corrosion effect may destroy the whole OLED device 30 preventing the OLED device 30 from producing any light.

To reduce a thickness of the sealed thin-film device 10 and to also reduce production cost of the sealed thin-film device 10, the sealing is preferably done via a sealing layer 20 directly applied to the thin-film device 30. Such sealing layers 20 are well known, especially applied to OLED devices 30. As indicated above, known sealing layers 20 may, for example, comprise a stack of a plurality of layers comprising silicon nitride-organic material-silicon nitride. The organic layer is relatively thick and planarizes particles which may be present in any of the stack of layers. Such sealing layer 20 constituted of this stack of layers does not prevent black-spots 60 from occurring, but delays the growth of the black-spot 60 as it forms a labyrinth for the water to enter the OLED device 30.

Alternatively the sealing layer 20 may be constituted of a plurality of inorganic layers and/or a layer constituted via electrochemical plating. The sealing layer 20, for example, may comprise stacks comprising silicon nitride-silicon oxide-silicon nitride, or silicon nitride-silicon oxinitride-silicon nitride, further also referred to as NON-stacks 20. Such NON-stacks 20 typically comprise multiple repetitions of this basic stack, typically about eight layers. In these alternative sealing layers 20, the number of black spots 60 occurring is strongly reduced. However, any remaining local breach 50 in such alternative sealing layer 20 causes the black-spot to continuously grow relatively fast (becoming visible within approximately 1 hour in a dampish environment).

The inventors have found that adding further sealing layers 20 to seal the thin-film device 30 or adding more layers to the stack constituting the sealing layer 20 only partially resolves the problem, as each further layer again bears the risk of having dust particles 62 embedded which may again form a local breach 50 in the added layer. Adding further sealing layers has a further negative effect in that each additional layer adds a production step to produce the sealed thin-film device which increases the cost of the sealed thin-film device while the operational life-time improvement may not be significant and/or sufficient.

The sealed thin-film device is typically provided on a substrate 70. The substrate 70 is for example made of a glass or metal layer. These materials have good barrier properties. Alternatively a polymer foil, e.g. a PET or PEN foil may be used as the substrate. In that case it is desirable that an additional sealing layer is present between the substrate and the thin-film device to be sealed.

Figure 1B:
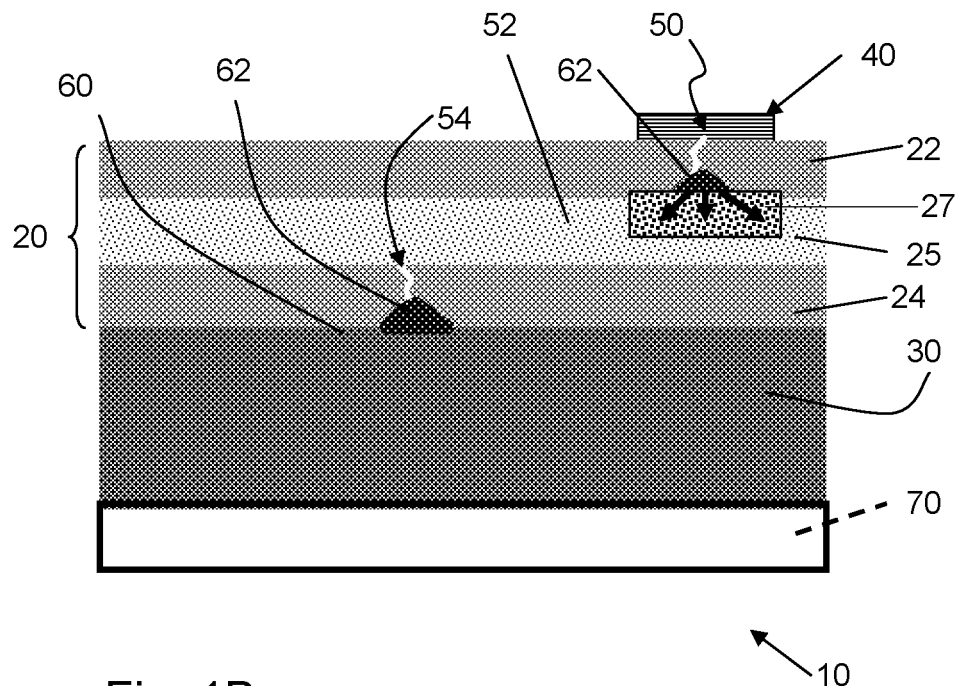
FIGS. 1B to 1D show schematic cross-sectional views of sealed thin-film devices according to the invention.
Figure 1C:
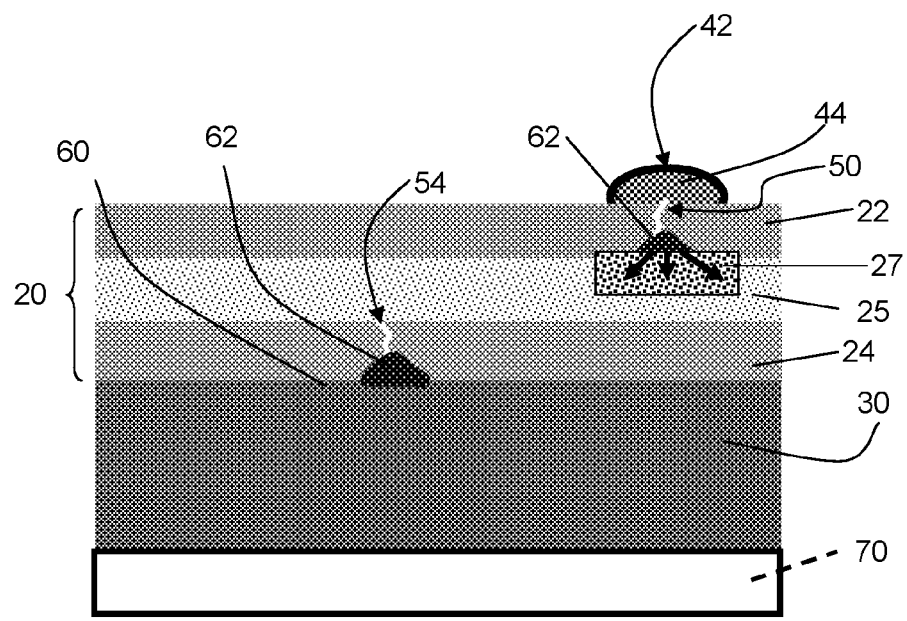
Figure 1D:
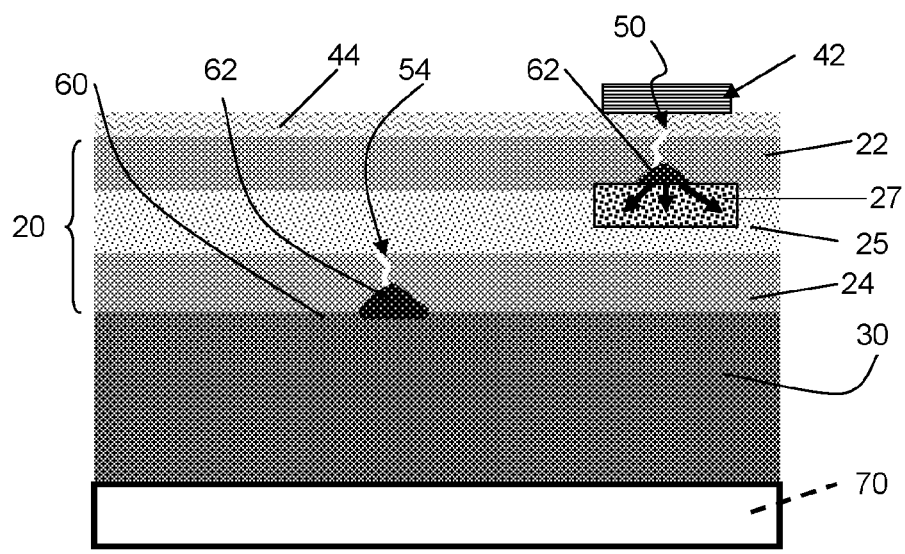

FIGS. 1B to 1D show schematic cross-sectional views of a sealed thin-film device 10, 12, 14 according to the invention. The sealed thin-film device 10, 12, 14 according to the invention comprises a thin-film device 30 and a sealing layer 20 applied on the thin-film device 30 for protecting the thin-film device 30. A getter layer 25 is present between the thin-film device 30 and the sealing layer 20. The getter layer comprises a getter material. The getter layer comprises a detectable deviation 27 at the location of said sealed local breach 50 due to an interaction between the detection substance that penetrated the local breach and the getter material in the getter layer. The sealed thin-film device 10, 12, 14 further comprises locally applied mending material 40; 42, 44 for sealing a local breach 50 in the sealing layer 20. As a result the local breach 50 in the top barrier layer 22 of the sealing layer 20 is sealed via locally applying the mending material 40; 42, 44. The diffusion path 52 therewith is interrupted, preventing any harmful environmental substances to get in contact with the thin-film device 30, thus improving the operational life-time of the thin-film device. Furthermore, the method of repairing the sealing layer 20 applied to a thin-film device 30 according to the invention typically requires only very little of the mending material 40; 42, 44 for sealing the local breach 50.

A local breach 50 is defined as a local variation in the sealing layer 20 which allows harmful environmental substances to come into contact with the thin-film device 30 to damage or start damaging the thin-film device 30. In this respect, the word "breach" is chosen to cover actual gaps, ruptures and pinholes in the sealing layer 20. Additionally, the word "breach" is chosen to also cover situations in which the sealing layer 20 is not actually broken but locally fails to perform the act of sealing due to the fact that the sealing layer 20 at the location of the breach 50 is, for example, porous to harmful environmental substances.

FIG. 1B shows an embodiment of the sealed thin-film device 10 in which a single type of mending material 40 is applied to the sealing layer 20 to generate the sealed thin-film device 10. This single type of mending material 40 may, for example, comprise an inorganic material 40, a metal material 40 locally deposited on the sealing layer 20. This local deposition of the mending material 40 may be done using well known deposition methods, for example, laser-deposition and printing deposition techniques. The benefit of such deposition techniques is that they are relatively well known and that it only requires marginal adaptations to the printing technique to apply the mending material 40 or a liquefied mending material 45 (see FIG. 3) locally on the sealing layer 20. Alternatively, the mending material may even comprise locally cured sealing material 40. As such, the sealing layer 20 may locally be softened. Subsequently the softened sealing material either flows, for example, under the influence of gravity, capillary forces and/or surface tension to close the breach 50 or is forced into the breach 50 in another manner.

Subsequent curing of the softened sealing material generated locally cured sealing material 40 which may be used for sealing the local breach 50.

The locally applied mending material 40 may at least partially be transparent to light emitted by the thin-film device 30. In this embodiment the thin-film device 30 of course is a light emitting thin-film device 30, for example, an OLED device 30. This at least partially transparent mending material 40 does not block light emitted from the light emitting layer of the light emitting thin-film device 30 and as such causes the deposited mending material 40 not to be visible. In addition, due to the typical Lambertian light emitting property of organic light emitting layers, part of the light emitted at regions adjacent to the applied mending material will emit light through the applied mending material 40, further reducing the local intensity variation due to the presence of the local breach 50. Finally, the presence of the substantially transparent mending material 40 may cause light which is captured in the sealing layer 20 to be extracted from the light emitting thin-film device 30, thus further reducing any intensity variations at the location of the applied mending material 40.

Alternatively, a dimension of the locally applied mending material 40 is small enough that it is substantially invisible to a naked human eye. This typically means that the dimension should be smaller than the minimum feature size which is noticeable by the human eye and/or the intensity variation caused by the presence of the mending material 40 should not be noticeable by the human eye.

FIG. 1C shows an embodiment of the sealed thin-film device 12 in which a combination of two different types of mending material 42, 44 is subsequently applied to the sealing layer 20 to generate the sealed thin-film device 10. The first material 44 may, for example, be an adhesion material 44 which is applied to improve the adhesion of a subsequent closing material 42 to the sealing layer 20. The first material 44 may also be a metal base-material 44 after which a metal closing material 42 is arranged on the metal base-material 44 to close any further local breaches (not shown) in the metal base-material 44. The first material 44 may also comprise getter material for absorbing any water in the neighborhood of the local breach 50 and to absorb any water which may pass the closing material 42 applied on top of the first material 44 comprising the getter material.

The first material 44 may have a substantially droplet-shape or a substantially spherical shape in which the contact angle between the first material 44 and the sealing layer 20 is less than 45 degrees. Such a first material 44 is chosen to have good contact between the sealing layer 20 and the first material 44 to ensure a good sealing of the local breach 50. Subsequently, the closing material 42 is applied on top of the first material 44 to ensure a hermetic sealing of the thin-film device 30 to generate the sealed thin-film device 12.

FIG. 1D shows a sealed thin-film device 14 in which the first material 44 is an adhesion layer 44 which is applied as a substantially uniform layer over the sealing layer 20. It may be convenient to apply the adhesion layer 44 as a homogeneous layer over the sealing layer 20. Any additional particles (not shown) present in the adhesion layer 44 would substantially not be harmful as typically no migration through the sealing layer 44 of harmful substances from the environment occurs through such adhesion layers 44. Furthermore, the chance that such additional particle would be located at the exact location of the local breach 50 is so small that this hardly influences the production yield of the sealed thin-film device 14. The actual closing material 42 is deposited locally to seal the sealing layer 220 at the identified local breach 50. Alternatively both the adhesion material 44 and the closing material 42 are both deposited locally to seal the local breach 50, similar as shown in FIG. 1C.

Figure 2:
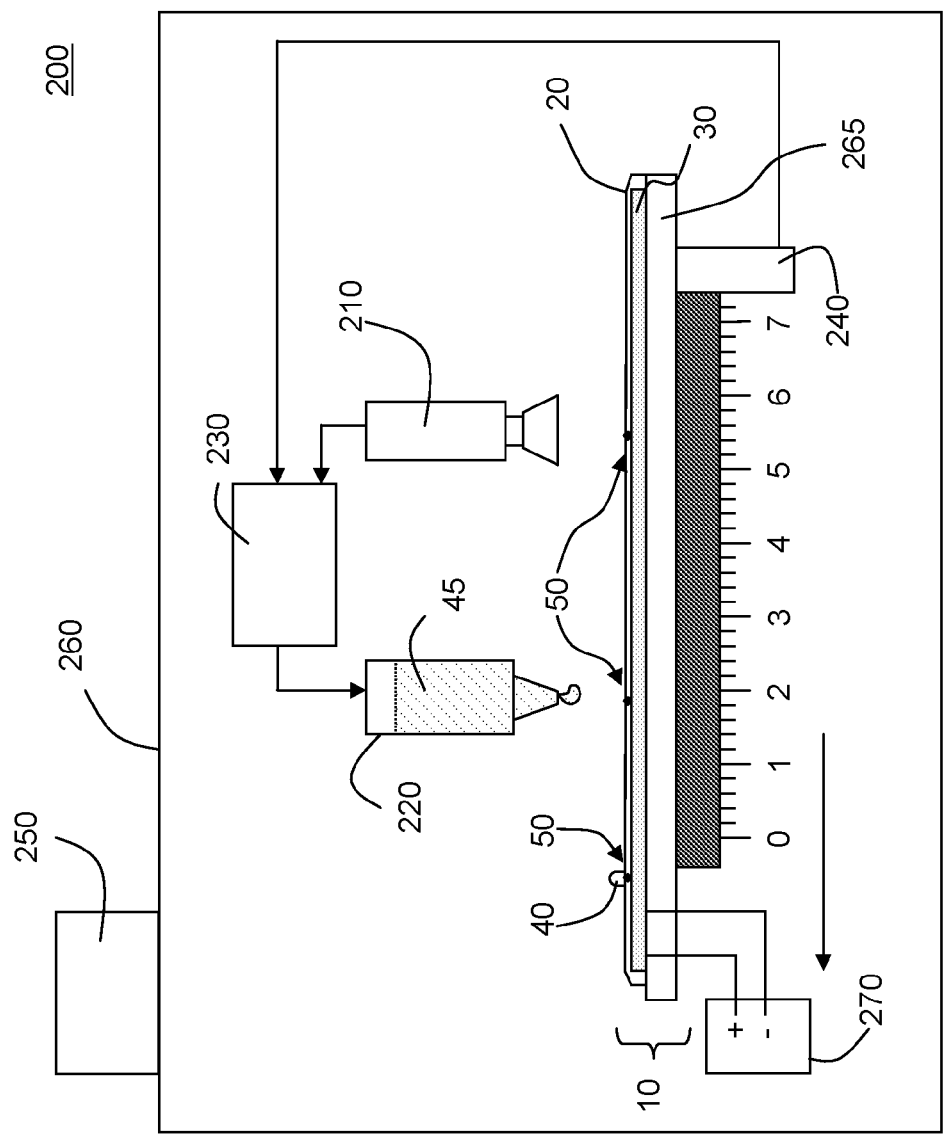
FIG. 2 shows a schematic representation of a system for repairing a sealing layer applied to a thin-film device for generating a sealed thin-film device.

FIG. 2 shows a schematic representation of a system 200 for repairing a sealing layer 20 applied to a thin-film device 30 for generating a sealed thin-film device 10, 12, 14.

The system comprises exposing means as described in more detail below for exposing the sealed thin-film device to an environment comprising a detection substance capable to cause a detectable deviation to said getter material. Accordingly the sealed device is exposed to said environment during an exposition time that is long enough to cause a detectable deviation in the getter layer, but too short to cause noticeable damages to the thin film device.

Figure 3:
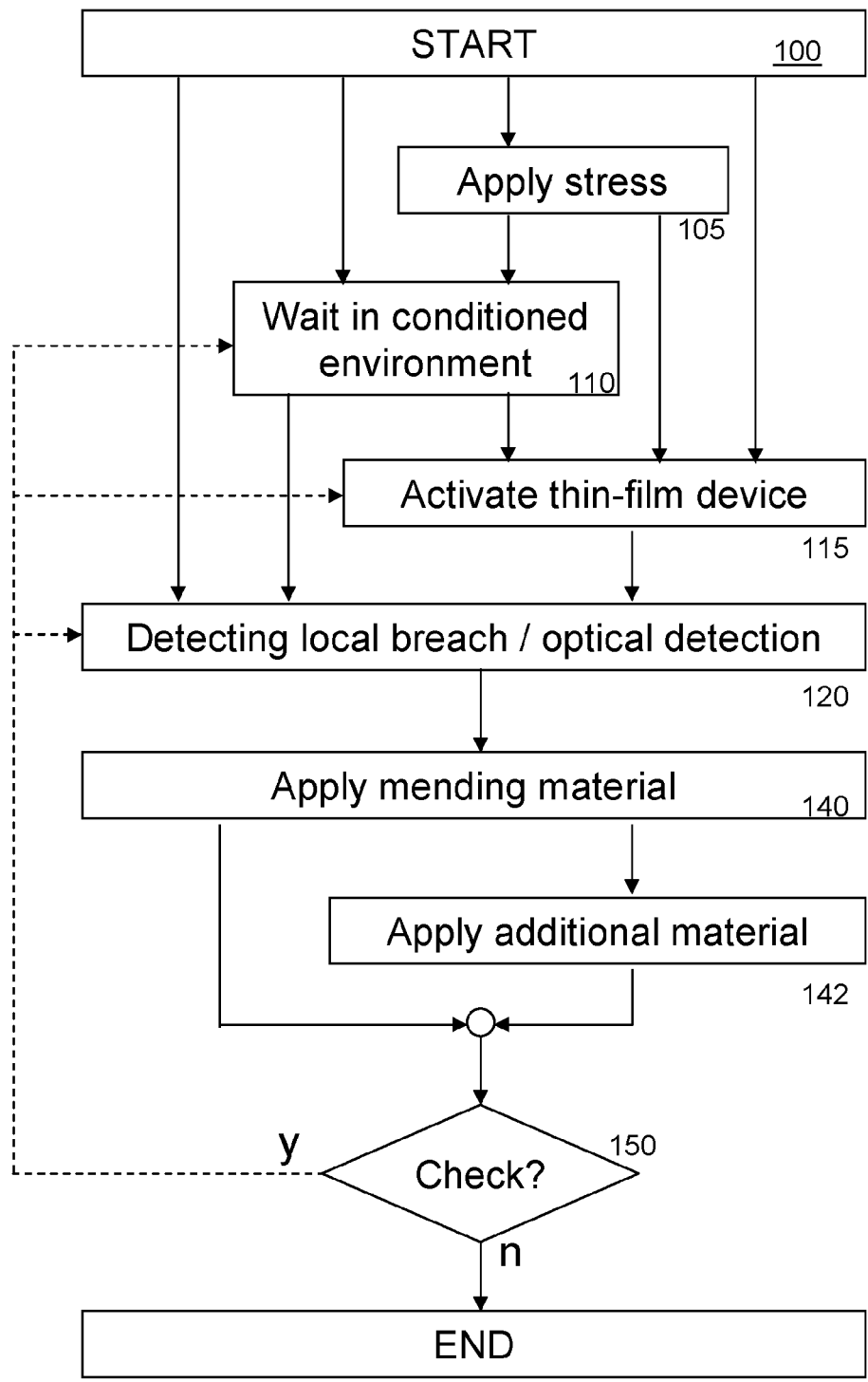
FIG. 3 shows a flow-diagram representing the possible steps in the method of repairing the sealed layer applied to the thin-film device.

The system 200 comprises detection means 210 for detecting a local breach 50 in the sealing layer 20 applied to the thin-film device 30 by detection of detectable deviations 27 of the getter layer 25. Such detection means 210 may, for example, be optical detection means 210, for example, a camera 210. However also other detection means 210 such as electrical detection (not shown), acoustical detection (not shown) or any other type of detection means 210 for detecting the local breach 50 may be used. The system 200 further comprises analyzing means 230 for analyzing a detection signal from the detection means 210 and to provide location information to mending means 220. The mending means 220 may be local deposition means 220, such as laser deposition means (not shown), or liquid printing deposition means 220 such as inkjet printing means 220 as illustrated in FIG. 3. Typically any deposition means 220 for depositing the mending material 40; 42, 44 may be used.

The exposing means therefore may include a timing means 250 that automatically initiates detection and repair of the sealed thin-film device after a predetermined duration of exposure of the device. Alternatively, an operator may start detection and repair after a predetermined duration of exposure of the device. In again another environment detection may start immediately after the thin-film device is sealed and a breach may be repaired immediately once it is detected by a detectable deviation of the getter material in the getter layer. The sealed thin-film device may be exposed to normal environmental conditions that are expected to occur during normal use. The exposing means may include environmental control means 260 for providing particular test conditions, such as a high temperature and a high humidity to accelerate the formation of detectable deviations in the getter layer. The timing means 250 and environmental-control means 260 for maintaining the thin-film device 30 together with the sealing layer 20 in a preconditioned environment during a predetermined time interval. In FIG. 2 the timing means 250 and the environmental-control means 260 are illustrated to surround the detection means 210, analyzing means 230 and mending means 220. However, the timing means 250 and environmental-control means 260 may be located at a different location than the actual detection means 210 and mending means 220. As indicated before, when the thin-film device 30 is an OLED device 30, the deviations 27 of the getter layer continue to grow radially. By having the thin-film device 30 in a predetermined environment for a predetermined time-period, the continuous growing of the deviations may be controlled such that an automated image capturing 210 and analyzing system 230 is well capable of localizing the local breaches 50 in the sealing layer 20 while the deviations 27 are still too small to be detected with the naked human eye. In an embodiment a getter layer may be used that does not show visually detectable deviations upon absorption of the detection substance, but only a machine detectable deviation. In that case it is sufficient that the exposure is stopped before the binding capacity of the getter layer is exhausted at the location of the breach. The predetermined time-period of exposure depends on the environment in which the thin-film device 30 is maintained, including the type of detection substance i.e. moisture or oxygen in the environment. For example the predetermined time period depends on the temperature and humidity at which the thin-film device 30 is maintained. The predetermined time-period also depends on the minimum dimensions which are detectable by the image capturing device 210 used in the system 200 and on the dimensions of the local breaches 50 which still have to be sealed by the system 200 of repairing the sealing layer 20.

Alternatively, the system 200 may also comprise further timing-means (not shown) and further environmental control means (not shown) which are configured for maintaining the sealed thin-film device 10, 12, 14 to check whether the applied mending material 40; 42, 44 has actually sealed the sealing layer 20. If the repair was not good enough, the identified deviations 27 in the getter layer continue to grow in the further environmental control means which may be detected by continuously monitoring the thin-film device 30, or via comparing the detected local breaches 50 with the information captured earlier by the detection means 210 before repair. As such, the sealing of the local breach 50 may be guaranteed using the further environmental control means. For such system a further detection means seems to be preferred. The analyzing of the two images or of the image detected by the detection means may be done by the analyzing means 230 or by a further analyzing means (not shown).

The system 200 as shown in FIG. 2 may also comprise stress-inducing means 260, 265 for generating a local breach 50 in a mechanically weak area of the thin-film device 30. Such stress-inducing means 260, 265 may, for example, induce stress in the thin-film device 30 via temperature variation and/or differences, for example, using the environmental-control means 260. Alternatively, the stress-inducing means 260, 265 may induce stress in the thin-film device 30 via deformation of the thin-film device 30, for example, via deforming the support 265 on which the thin-film device 30 rests during the applying of the mending material 40; 42, 44 onto the sealing layer 20. The presence of this stress-inducing means 260, 265 enables the repair of mechanically weak areas which may later result in reliability issues of the thin-film device 30.

The system 200 as shown in FIG. 2 also comprises transportation means 240 for moving the thin-film device 30 in a controlled manner from the detection means 210 to the mending means 220, for example, in the direction of the arrow. The transportation means 240 comprises a kind of ruler (indicated with the number 0 to 7 in FIG. 2) to measure the position of the transportation means 240 with respect to the detection means 210 and provides this signal to the analyzing means 230 to determine location information where the detected local breach 50 is located. Furthermore, the system 200 may comprise activation means 270 for activating the thin-film device 30. When the thin-film device 30 is a light emitting thin-film device 30, the light emitting thin-film device 30 will start emitting light which may be used by the detection means 210 to identify the local breach 50.

FIG. 3 shows a flow-diagram 100 representing the possible steps in the method 100 of repairing the sealed layer 20 applied to the thin-film device 30.

The method 100 of repairing the sealed layer 20 starts with optional steps of "apply stress" 105, "wait in conditioned environment" 110 and "activate thin-film device" 115. These steps are optional, as the step 105 of apply stress may be done for detecting mechanically weak areas in the thin-film device before sealing any local breach in the sealing layer 30, the step 110 of waiting in a conditioned environment may enhance the controlled growing of detectable deviations in, for example, the OLED device 30, but are not absolutely necessary to identify the local breach 50 in the sealing layer 20. Also the activation step 115 for activating the thin-film device 30 may enhance the ease of identifying the local breach 50 in the sealing layer 20, but may also be omitted if the detection means 210 is capable of detecting the breach without the need of the light-emitting thin-film device 30 to be switched on. Subsequently, the step of "detecting local breach" 120 is performed during which the local breach 50 is detected. This detection may be done via optical detection, but may also be done via any other detection method which is suitable for identifying and locating the local breach 50 in the sealing layer 20 by detection of a detectable deviation in the getter layer 25. Subsequently the step of "applying mending material" 140 is done to apply the mending material 40; 42, 44. This applying of the mending material 140 may be done via depositing the mending material 40, 42, 44 or via local curing of the sealing material 20 to close the breach 50 in the sealing layer. Optionally, the step of "apply additional material" 142 is shown which may be necessary when the mending material 40; 42, 44 is constituted of two different mending materials 42, 44 which have to be applied subsequently to the sealing layer 20 to seal the breach 50. Finally, the method 100 of repairing comprises a step of "check?" 150 during which a choice may be added whether or not the quality of the repair is checked. If the quality of the repair has to be checked, a part of the method 100 has to be redone, for example, via the same system 200 for repairing as shown in FIG. 2 or via a further system 200 of repairing which may, for example, work in a similar fashion as the system 200 of FIG. 2 or be similar to the system 200 of FIG. 2. The checking of the quality of the repair may start at step 110 in which the repaired thin-film device 30 is again put in a conditioned environment to have the detectable deviations in the getter layer grow in a controlled manner. The checking of the quality of the repair may alternatively start at the step 115 of activating the thin-film device, or at the step 120 of detecting the local breach 50.

Figure 4A:
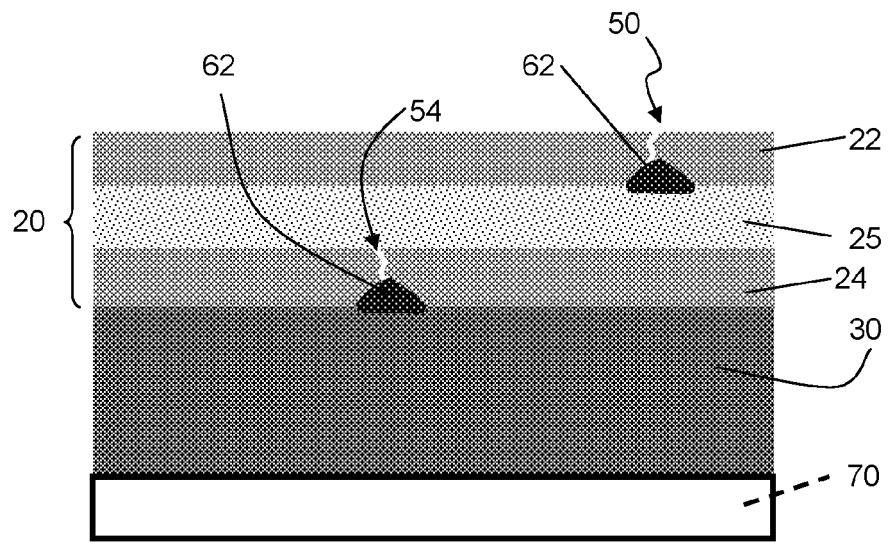
FIG. 4A shows a schematic cross-sectional view of a thin-film device comprising a sealing layer, a getter layer and a local breach, FIG. 4B schematically shows the thin-film device of FIG. 4A according to the same cross-sectional view after exposure during a first exposure time.
Figure 4B:
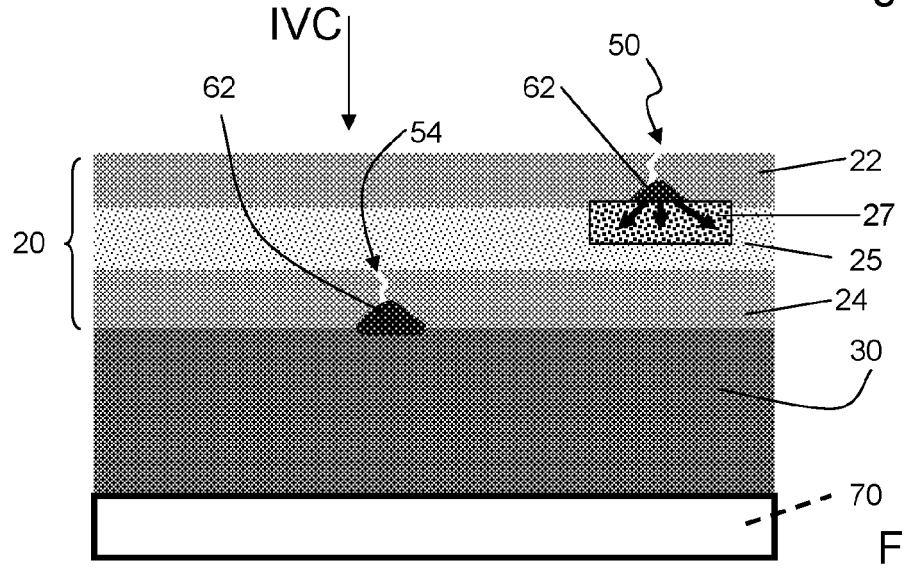
FIG. 4C shows a picture of a first sample of a thin-film device after exposure during a first exposure time according to view IVC in FIG. 4B.
FIG. 4D shows a picture of the first sample according to view IVC in FIG. 4B after an exposure during a second exposure time.
FIG. 4E shows a light pattern of said first sample according to view IVE in FIG. 4B after said during a second exposure time.
FIG. 4F shows the sealed thin-film device of FIG. 4A after it is repaired in a relatively late stage.
Figure 4C:
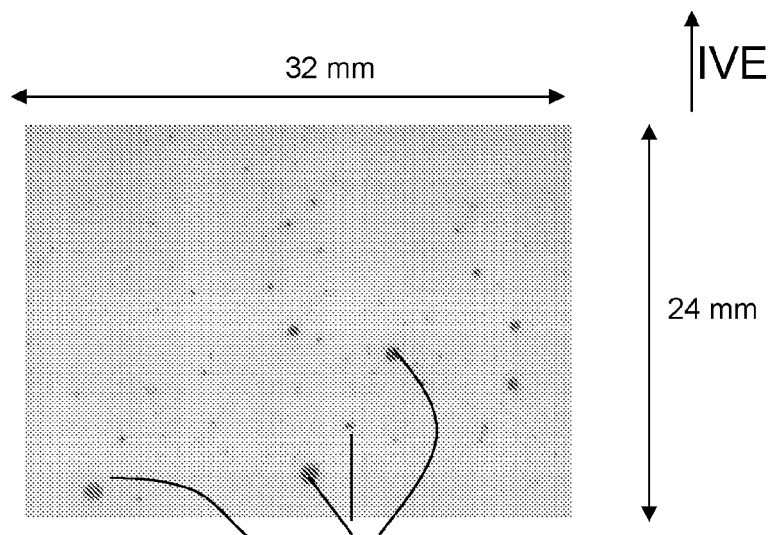

By way of example a sealed thin-film device 10 was manufactured as illustrated in FIG. 4A. The sealed thin-film device 10 comprises a thin-film device 30 that is sealed by a sealing layer 20 and further comprises a getter layer 25 arranged between the sealing layer 20 and the thin-film device 30. The getter layer 25 was composed of an organic layer comprising 5 weight % CaO nano-particles. The sealed thin-film device 10 shown in FIG. 4A was exposed during 504 hours (3 wks) to an environment having a temperature of 60° C. and having a relative humidity of 90%. As shown schematically in FIG. 4B, after this exposure breaches in the sealing layer 20 are well detectable as grey spots 27 in the otherwise substantially transparent getter layer 25. FIG. 4C also illustrates this with a picture according to view IVC. Due to the fact that the breaches 50 in the first barrier layer 22 are typically remote from the breaches in the second barrier layer 24, the grey spots 27 in the getter layer 25 can be detected amply before the moisture reaches the second barrier layer 24. This is confirmed by the fact that at this stage no black spots were formed yet in the thin-film device. According to the method of the present invention these grey spots 27 can be detected and mending material 42 can be locally applied for sealing the local breach to produce the sealed thin-film device 10, 12 or 14 as shown in FIG. 1B, 1C or 1D for example, therewith preventing black spot formation in the OLED.

Figure 4D:
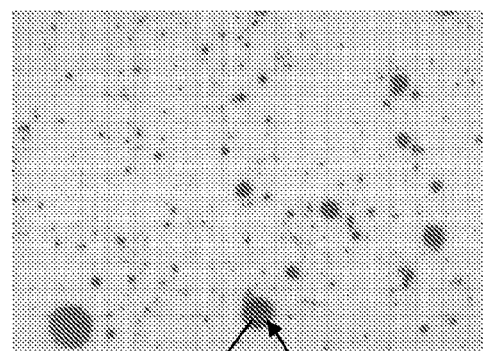
Figure 4E:
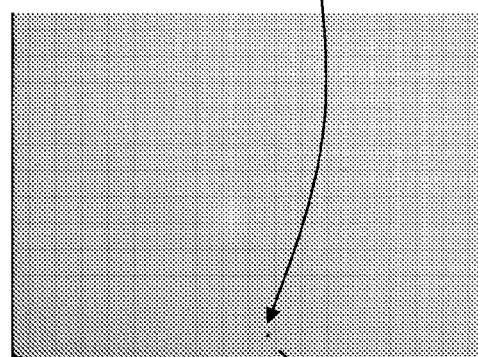
Figure 4F:
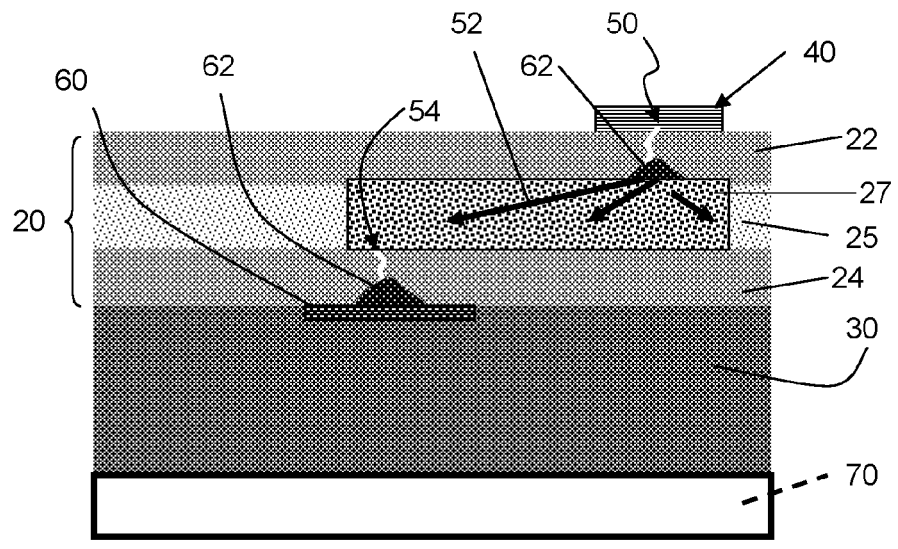

FIG. 4D shows a picture of the sealed thin-film device, according to view IVC, after it was further exposed in the same environment until a total exposure time of 2500 hours. FIG. 4E shows a picture according to view IVD of the light-pattern emitted by the OLED during operation. At this point in time one black spot 60 became detectable therein having a position corresponding to that of a grey spot 27 indicated for the getter layer in FIG. 4E. This shows that a relatively long time expires between the moment that deviations 27 in the getter layer 25 become detectable and the moment that moisture or other atmospheric substance starts to damage the thin film device. Accordingly, ample time is available to repair the sealing layer and therewith prevent damage to the thin film device. At this point in time it would even be possible to apply the method of repairing the sealed thin film device so as to obtain the sealed thin-film device 16 illustrated in FIG. 4F, as the black spots 60 still are relatively small. It is preferred however to start repair before black spots 60 are formed.

Similar results as demonstrated with reference to FIG. 4A-F were demonstrated for samples having a getter layer comprising 10 weight % CaO nano-particles.

Figure 5A:
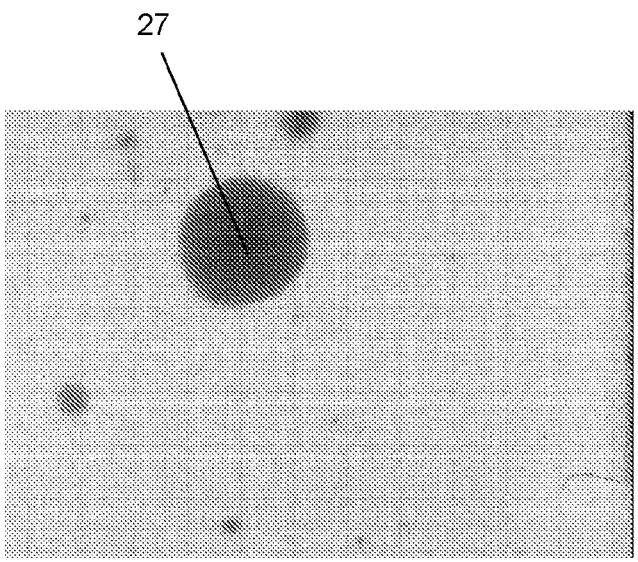
FIG. 5A shows a picture of a second sample of a thin-film device according to view IVC in FIG. 4B after an exposure during a third exposure time.
Figure 5B:
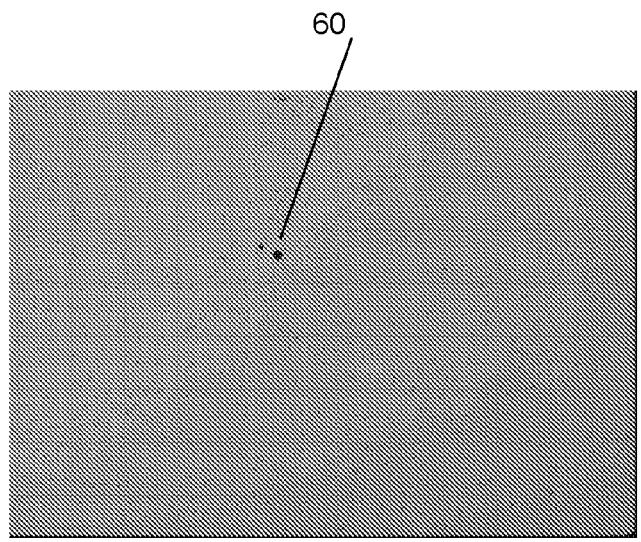
FIG. 5B shows a light pattern of said second sample according to view IVE in FIG. 4B after said during a third exposure time.
Figure 5C:
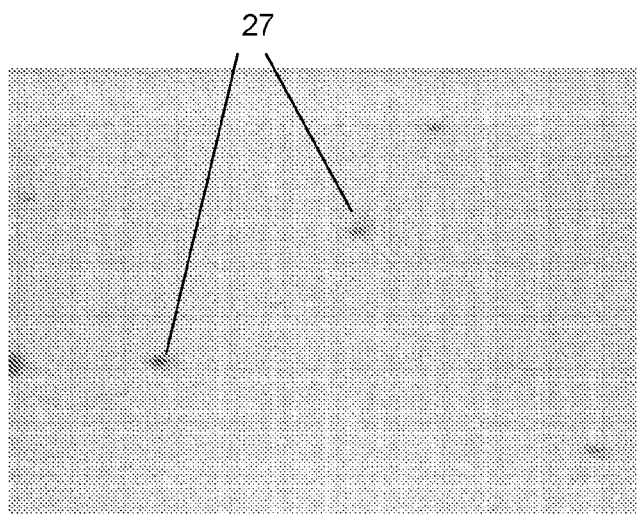
FIG. 5C shows a picture of a third sample of a thin-film device according to view IVC in FIG. 4B after an exposure during a third exposure time.

The experiment was also carried out for a second sample and a third sample having a getter layer comprising 5% by weight of zeolite-particles in an acrylate layer. Results thereof are shown in FIGS. 5A, B for the second sample and in FIG. 5C for the third sample. The second and the third sample were each exposed to an environment having a temperature of 60° C. and having a relative humidity of 90% for 2500 hours. At that point in time the getter layer 25 of the second sample (FIG. 5A) and the third sample (FIG. 5C) showed clear deviations 27 indicative for breaches 60 in the outer barrier layer 22. The second sample showed two minor black spots 60 (FIG. 2B) in the thin-film device. The third sample (FIG. 2C) did not show black spots yet.

The samples shown in FIGS. 4C-E and FIGS. 5A, B and C each have a size of 32×24 mm as indicated in FIG. 4C. Accordingly, also in this case typically the deviations 27 in the getter layer become detectable long before damage of the sealed thin film device occurs, so that ample time is available to repair the breaches in the barrier layer indicated by the deviations 27.

Figure 6A:
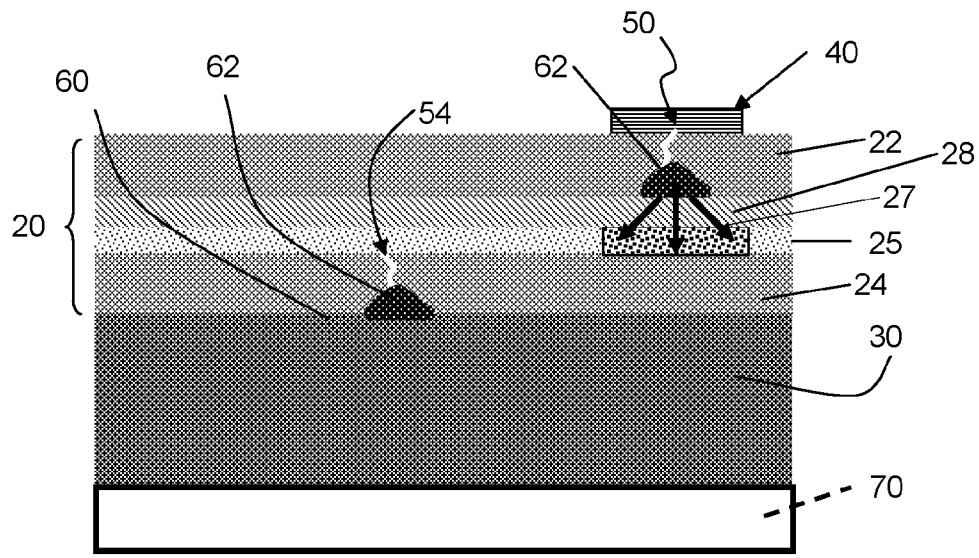
FIG. 6A shows in the schematic cross-sectional view a further embodiment of a sealed thin-film device according to the invention.

FIG. 6A shows a further embodiment of sealed thin-film device 17 according to the present invention. In that embodiment an organic layer 28 is present between the getter layer 25 and the outer barrier layer 22. This organic layer 28 may serve as a planarizing layer in case the getter layer 25 comprises relatively course particles. In the embodiment of FIG. 6A the outer barrier layer 22 is repaired by a single type 42 of mending material. However, alternatively the outer barrier layer 22 may be repaired otherwise, e.g. as described with reference to FIG. 1C or FIG. 1D.

Figure 6B:
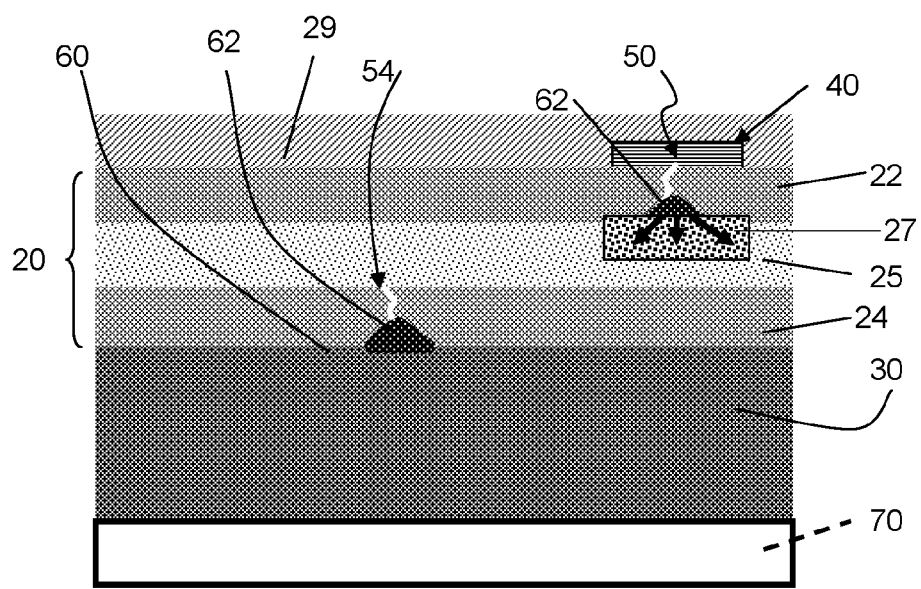
FIG. 6B shows in the schematic cross-sectional view a still further embodiment of sealed thin-film device according to the invention.

FIG. 6B shows a still further embodiment of sealed thin-film device 18 according to the present invention. In that embodiment a protection layer 29 is applied over the outer barrier layer 22 and the locally applied mending material 42. The protection layer 29 protects the barrier layer 22 and the locally applied mending material 42 from mechanical causes. The embodiment of FIG. 6B may further include an organic layer 29 as described with reference to FIG. 6A. The outer barrier layer 22 may be repaired by a single type single type 42 of mending material as shown in FIG. 6B. However, alternatively the outer barrier layer 22 may be repaired otherwise, e.g. as described with reference to FIG. 1C or FIG. 1D.

It is important that the mending material is applied directly on the barrier layer having the breach, to avoid that moisture or other substances enter the breach via an intermediate layer. In case the breach 50 is detected after the (mechanical) protection layer 29 is applied, the protection layer 29 may be locally removed by drilling, e.g. by laser drilling to expose the location of the breach. Subsequently the mending material 62 can be applied directly on the layer having the breach. It is sufficient that only one of the barriers is repaired. For example in FIG. 6B it suffices that the (most significant) breaches 50 in the barrier layer 22 are repaired. It is not necessary to repair also the underlying barrier layer 24.

Figure 7A:
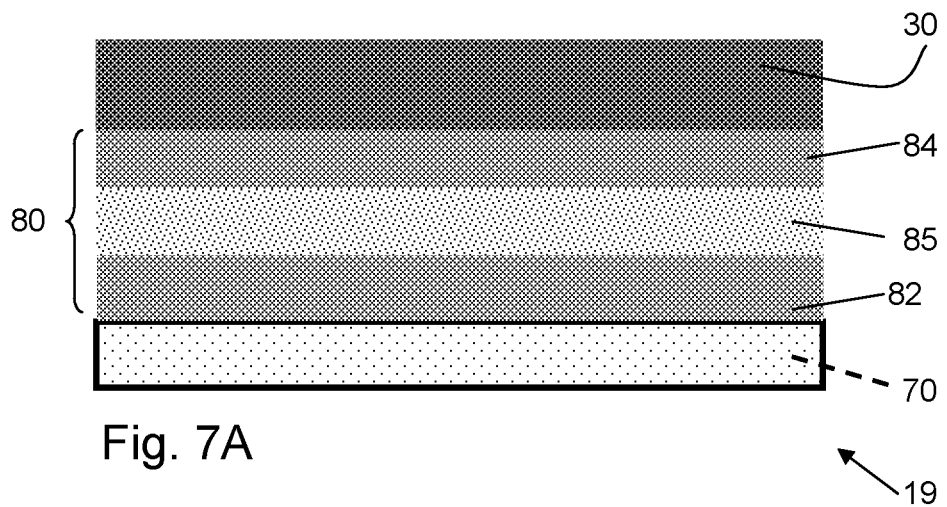
FIG. 7A-7E show in cross-sectional views a method of repairing a thin-film device according to a further embodiment of the present invention, therein FIG. 7A schematically shows part of the thin-film device according said further embodiment.
Figure 7B:
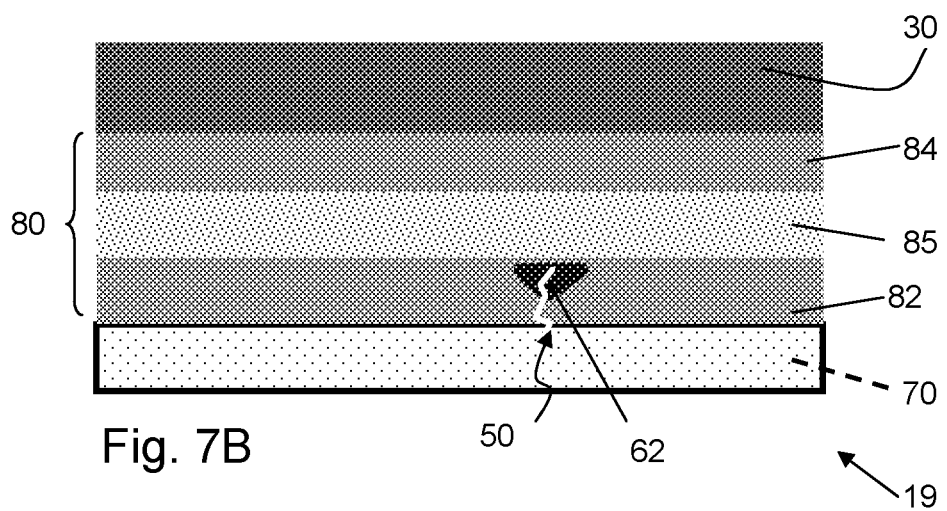
Figure 7C:
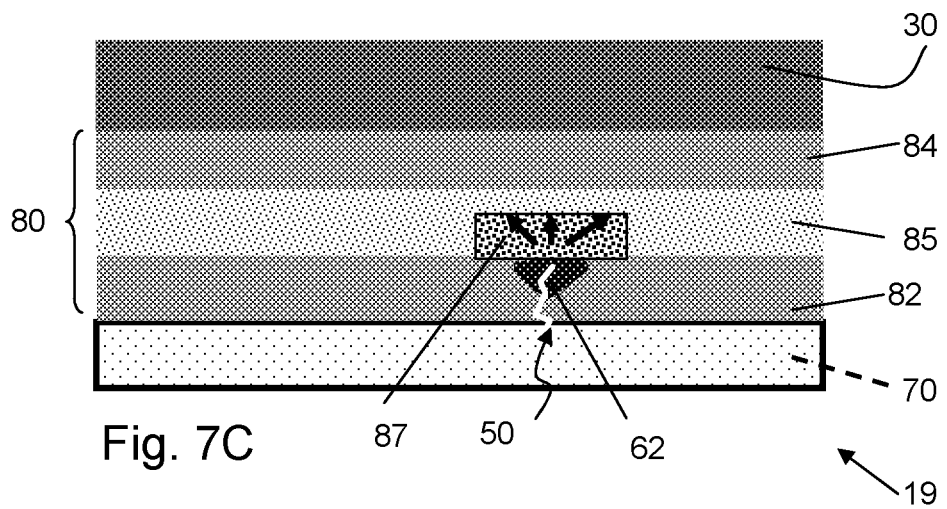
Figure 7D:
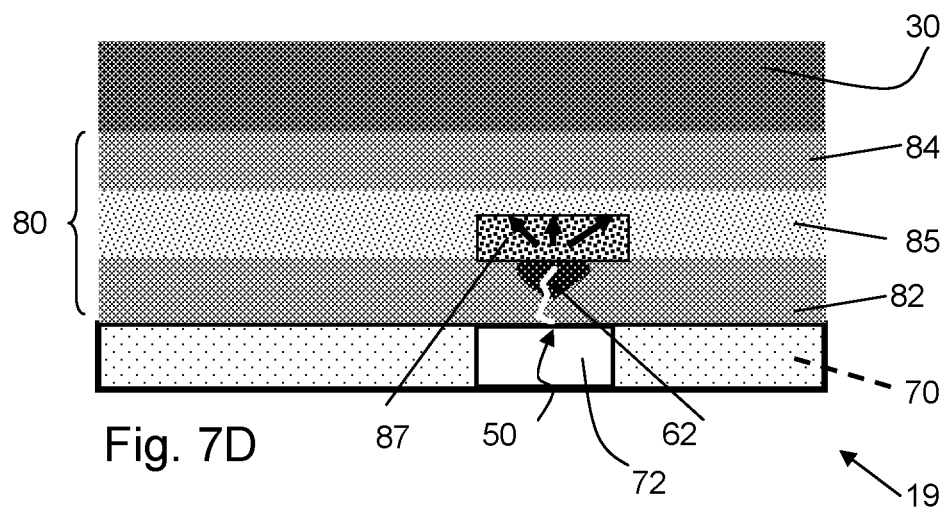
Figure 7E:
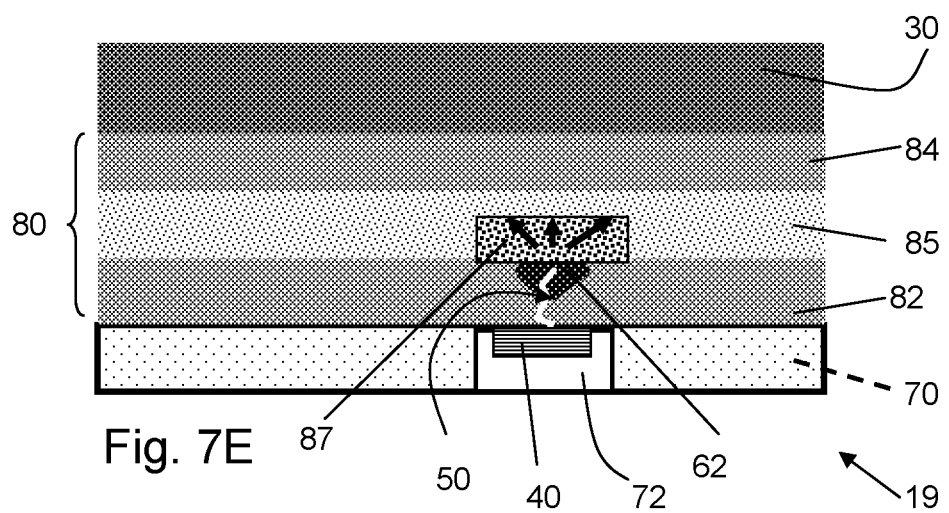

It is noted that the present invention is applicable both to a barrier layer on the cathode side as well as to a barrier layer on the anode side of the device. The present invention is also applicable to a hidden barrier layer. In an embodiment shown in FIG. 7A, the sealed thin-film device 19 is opposite its light emission window mounted on a substrate 70 formed by a polymer foil and it is provided with a sealing layer 80 arranged between the thin-film device 30 and the polymer foil 70. As in the embodiments described before, the sealing layer 80 comprises a first barrier layer 82 and a second barrier layer 84, and getter layer 85 sandwiched between the first and the second barrier layer 82, 84. For clarity, further layers on a side of the thin-film device 30 opposite the sealing layer 80 are not shown therein. It has been found that deviations in the getter layer 85 in said sealing layer 80, i.e. between the barrier layers 82, 84 of said sealing layer 80 can still be detected accurately. Breaches in the barrier layer 82 of said sealing layer 80 between the polymer foil 70 and the thin film device 30 can be repaired in the same way as in the case where the breaches are covered by a protection layer. This is illustrated in FIG. 7B-E. FIG. 7B shows an example of a breach 50 present in the first barrier layer 82, caused by a particle 62. In case the substrate 70 is formed by a relatively moisture permeable material, such as a polymer foil, this will cause moisture to penetrate the breach 82 and to interact with the material of the getter layer 85, causing a detectable deviation 87, as shown in FIG. 7C. Upon detection of said deviation 87 the substrate 70 is locally removed, e.g. by drilling a hole 72, e.g. by laser drilling to expose the location of the breach as shown in FIG. 7D. Therewith the first barrier layer 82 is exposed at the location of the breach 50. In a subsequent step mending material 40 is applied directly on the first barrier layer 82 facing the substrate 70 within the hole 72 at the location of the breach 50, as shown in FIG. 7E. In case the sealed thin-film device has a sealing layer on both sides of the thin-film device and it is not clearly visible in which one of said sealing layers a deviation is detected the outer barrier layers of each of said sealing layers may be repaired.

The method shown in FIG. 7A-E is equally applicable for repair of a sealing layer that is provided with a mechanical protection layer.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements or by means of software. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A sealed thin-film device comprising:
   a thin-film device; and
   a sealing layer applied to the thin-film device for protecting the thin-film device from environmental influence, the sealing layer comprising at least a first and a second barrier layer, an outer one of said barrier layers having a local breach that is sealed by locally applied mending material,
   wherein a getter layer is present between the first and the second barrier layer, which getter layer comprises a getter material, wherein the getter material of the getter layer has a detectable deviation at the location of said sealed local breach and that the mending material is applied at least one of directly on the outer one of said barrier layers or directly on an adhesion layer that is applied directly on the outer one of said barrier layers.

2. The sealed thin-film device according to claim 1, wherein the thin-film device is a light emitting thin-film device.

3. The sealed thin-film device according to claim 1, wherein the locally applied mending material comprises at least one of:
   inorganic material configured for sealing the local breach and configured for being locally deposited,
   metal material configured for sealing the local breach and configured for being locally deposited, or
   locally cured sealing material from the sealing layer for sealing the local breach.

4. The sealed thin-film device according to claim 1, wherein the locally applied mending material comprises two different materials together sealing the local breach, the mending material being selected from a group comprising:
   an adhesion material and a closing material, the adhesion material being applied to the sealing layer for improving an adhesion of the closing material to seal the local breach,
   a metal base-material and a metal closing material for sealing a further local breach in the metal base-material, the metal base-material being applied to the sealing layer,
   a substantially droplet-shaped or substantially spherically shaped first material and a closing material, the substantially droplet shaped or substantially spherically shaped first material having a contact angle between the substantially droplet-shaped or substantially spherically shaped first material and the sealing layer of less than 45 degrees, the closing material covering the substantially droplet-shaped or substantially spherically shaped first material for completely sealing the local breach, or
   a first material comprising a getter material and a closing material, the first material reducing water entering the local breach and the closing material being applied on the first material for sealing the local breach.

5. The sealed thin-film device according to claim 1, wherein the locally applied mending material is at least one of at least partially transparent to light emitted by the thin-film device or wherein a dimension of the locally applied mending material is configured for being substantially invisible to a naked human eye.

* * * * *